United States Patent
Regan et al.

(10) Patent No.: US 9,540,725 B2
(45) Date of Patent: Jan. 10, 2017

(54) METHOD AND APPARATUS FOR BEAM DEFLECTION IN A GAS CLUSTER ION BEAM SYSTEM

(71) Applicant: TEL Epion Inc., Billerica, MA (US)

(72) Inventors: Kenneth Regan, Beverly, MA (US); Yan Shao, Andover, MA (US); Robert K. Becker, Danvers, MA (US); Christopher K. Olsen, Peabody, MA (US)

(73) Assignee: TEL Epion Inc., Billerica, MA (US)

( * ) Notice: Subject to any disclaimer, the term of this patent is extended or adjusted under 35 U.S.C. 154(b) by 0 days.

(21) Appl. No.: 14/696,063

(22) Filed: Apr. 24, 2015

(65) Prior Publication Data
US 2015/0332924 A1 Nov. 19, 2015

Related U.S. Application Data

(60) Provisional application No. 61/993,007, filed on May 14, 2014.

(51) Int. Cl.
*H01L 21/425* (2006.01)
*C23C 14/22* (2006.01)
(Continued)

(52) U.S. Cl.
CPC ............ *C23C 14/221* (2013.01); *C23C 14/10* (2013.01); *H01J 37/08* (2013.01); *H01J 37/1477* (2013.01);
(Continued)

(58) Field of Classification Search
None
See application file for complete search history.

(56) References Cited

U.S. PATENT DOCUMENTS 3,906,237 A 9/1975 Pittaway
4,152,478 A 5/1979 Takagi
(Continued)

FOREIGN PATENT DOCUMENTS

EP 0984481 A2 3/2000
EP 1936653 A1 6/2008
(Continued)

OTHER PUBLICATIONS

Park et al., Evolution of Residual Stress in Plasma-enhanced Chemical-Vapor-Deposited Silicon Dioxide Film Exposed to Room Air, Applied Physics Letters, Dec. 13, 1999, pp. 3811-3813, vol. 75, No. 24.
(Continued)

*Primary Examiner* — David E Graybill
(74) *Attorney, Agent, or Firm* — Wood Herron & Evans LLP

(57) ABSTRACT

Provided is a method of controlling a gas cluster ion beam (GCIB) system for processing structures on a substrate. A GCIB system comprises deflection plates for directing a GCIB towards a substrate, the GCIB system coupled to a substrate scanning device configured to move a substrate in three dimensions. The substrate is exposed to the GCIB while the substrate is being moved by the substrate scanning device. A controller is used to control a set of deflection operating parameters comprising a deflection angle φ, voltage differential of the deflection plates, frequency of the deflection plate power, beam current, substrate distance, pressure in the nozzle, gas flow rate in the process chamber, separation of beam burns, duration of the bean burn, and/or duty cycle of the beam deflector output.

20 Claims, 20 Drawing Sheets

(51) Int. Cl.
*H01L 21/265* (2006.01)
*H01L 21/263* (2006.01)
*H01L 21/02* (2006.01)
*H01L 21/285* (2006.01)
*H01J 37/08* (2006.01)
*H01J 37/147* (2006.01)
*H01J 37/317* (2006.01)
*C23C 14/10* (2006.01)

(52) U.S. Cl.
CPC .......... *H01J 37/317* (2013.01); *H01J 37/3171* (2013.01); *H01L 21/0262* (2013.01); *H01L 21/02271* (2013.01); *H01L 21/2633* (2013.01); *H01L 21/26566* (2013.01); *H01L 21/28556* (2013.01); *H01J 2237/0812* (2013.01)

(56) References Cited

U.S. PATENT DOCUMENTS

| | | |
|---|---|---|
| 4,361,762 A | 11/1982 | Douglas |
| 4,740,267 A | 4/1988 | Knauer et al. |
| 4,760,253 A | 7/1988 | Hutton |
| 4,833,319 A | 5/1989 | Knauer |
| 4,886,971 A | 12/1989 | Matsumura et al. |
| 4,916,311 A | 4/1990 | Fuzishita et al. |
| 5,051,584 A | 9/1991 | Gray et al. |
| 5,331,159 A | 7/1994 | Apffel, Jr. et al. |
| 5,459,326 A | 10/1995 | Yamada |
| 5,814,194 A | 9/1998 | Deguchi et al. |
| 5,821,548 A | 10/1998 | Hinchliffe |
| 5,907,780 A | 5/1999 | Gilmer et al. |
| 6,011,345 A * | 1/2000 | Murray ............... H01L 41/042 310/316.01 |
| 6,124,620 A | 9/2000 | Gardner et al. |
| 6,128,207 A | 10/2000 | Lien et al. |
| 6,207,282 B1 | 3/2001 | Deguchi et al. |
| 6,218,207 B1 | 4/2001 | Itoh et al. |
| 6,302,253 B1 | 10/2001 | Link et al. |
| 6,416,820 B1 | 7/2002 | Yamada et al. |
| 6,486,478 B1 | 11/2002 | Libby et al. |
| 6,537,606 B2 * | 3/2003 | Allen ................... H01J 37/317 118/664 |
| 6,629,508 B2 | 10/2003 | Dykstra |
| 6,635,883 B2 | 10/2003 | Torti et al. |
| 6,646,277 B2 | 11/2003 | Mack et al. |
| 6,797,334 B2 | 9/2004 | Akizuki et al. |
| 6,797,339 B2 | 9/2004 | Akizuki et al. |
| 6,814,205 B2 | 11/2004 | Feldhaus et al. |
| 6,860,373 B2 | 3/2005 | Kundermann et al. |
| 6,880,494 B2 | 4/2005 | Hoose |
| 6,990,942 B2 | 1/2006 | Takeuchi |
| 7,060,989 B2 | 6/2006 | Swenson et al. |
| 7,067,828 B2 | 6/2006 | Swenson |
| 7,114,605 B2 | 10/2006 | Grosspietsch et al. |
| 7,173,252 B2 | 2/2007 | Mack |
| 7,182,061 B2 | 2/2007 | Georgescu |
| 7,237,542 B2 | 7/2007 | Reisser |
| 7,240,645 B2 | 7/2007 | Reisser |
| 7,259,036 B2 | 8/2007 | Borland et al. |
| 7,377,228 B2 | 5/2008 | Mack |
| 7,380,527 B2 | 6/2008 | Reisser |
| 7,415,962 B2 | 8/2008 | Reisser |
| 7,600,490 B2 | 10/2009 | Reisser |
| 7,642,531 B2 | 1/2010 | Gwinn et al. |
| 7,670,964 B2 | 3/2010 | Lane |
| 7,721,701 B2 | 5/2010 | Dec |
| 7,730,869 B2 | 6/2010 | Li |
| 7,825,389 B2 | 11/2010 | Hautala et al. |
| 7,968,422 B2 | 6/2011 | Hautala |
| 8,097,860 B2 | 1/2012 | Tabat et al. |
| 8,173,980 B2 | 5/2012 | Graf et al. |
| 8,187,971 B2 | 5/2012 | Russell et al. |
| 8,210,151 B2 | 7/2012 | Drachko |
| 8,226,835 B2 | 7/2012 | Hautala et al. |
| 8,237,136 B2 | 8/2012 | Hautala et al. |
| 8,304,033 B2 | 11/2012 | Tabat et al. |
| 8,764,952 B2 | 7/2014 | Sato et al. |
| 8,981,322 B2 | 3/2015 | Tabat et al. |
| 9,117,628 B2 * | 8/2015 | Kirkpatrick |
| 2002/0005676 A1 | 1/2002 | Greer |
| 2002/0014407 A1 * | 2/2002 | Allen ................... H01J 37/317 204/298.36 |
| 2002/0068128 A1 | 6/2002 | Akizuki et al. |
| 2002/0130275 A1 | 9/2002 | Mack et al. |
| 2003/0132471 A1 | 7/2003 | Matsui et al. |
| 2004/0222389 A1 * | 11/2004 | Swenson ............... C23C 14/221 250/492.21 |
| 2005/0023461 A1 | 2/2005 | Schubert et al. |
| 2005/0051096 A1 | 3/2005 | Horsky et al. |
| 2005/0155951 A1 | 7/2005 | Suzuki et al. |
| 2005/0181621 A1 | 8/2005 | Borland et al. |
| 2006/0105570 A1 | 5/2006 | Hautala et al. |
| 2006/0124934 A1 | 6/2006 | Fukumiya et al. |
| 2006/0277017 A1 | 12/2006 | Sproch et al. |
| 2006/0278611 A1 | 12/2006 | Sato et al. |
| 2007/0099380 A1 | 5/2007 | Kim |
| 2007/0184655 A1 | 8/2007 | Learn et al. |
| 2007/0184656 A1 | 8/2007 | Sherman et al. |
| 2007/0199537 A1 | 8/2007 | Morgado |
| 2007/0210366 A1 | 9/2007 | Sandhu et al. |
| 2007/0224824 A1 | 9/2007 | Chen et al. |
| 2008/0149826 A1 | 6/2008 | Renau et al. |
| 2008/0245345 A1 | 10/2008 | Huettlin |
| 2009/0001282 A1 * | 1/2009 | Hofmeester ......... G01B 11/0683 250/424 |
| 2009/0140165 A1 | 6/2009 | Hautala et al. |
| 2009/0152629 A1 | 6/2009 | Hu et al. |
| 2009/0321658 A1 | 12/2009 | Kirkpatrick et al. |
| 2010/0193472 A1 | 8/2010 | Tabat et al. |
| 2010/0193708 A1 | 8/2010 | Tabat et al. |
| 2010/0200774 A1 | 8/2010 | Burke et al. |
| 2010/0243913 A1 | 9/2010 | Becker et al. |
| 2011/0155897 A1 | 6/2011 | Harrison |
| 2011/0272594 A1 | 11/2011 | Graf et al. |
| 2011/0300599 A1 * | 12/2011 | Khoury ................... A61L 27/18 435/180 |
| 2012/0045615 A1 * | 2/2012 | Kirkpatrick ............. H01J 37/05 428/141 |
| 2013/0022494 A1 * | 1/2013 | Kirkpatrick ............. A61L 2/087 422/22 |
| 2013/0105710 A1 * | 5/2013 | Kirkpatrick ....... H01L 21/26566 250/472.1 |
| 2013/0213933 A1 * | 8/2013 | Kirkpatrick ............. H01J 37/08 216/60 |
| 2013/0218264 A1 * | 8/2013 | Svrluga ................... A61L 27/54 623/1.42 |
| 2013/0282136 A1 * | 10/2013 | Khoury ................... A61L 27/54 623/23.57 |
| 2014/0074159 A1 * | 3/2014 | Khoury ................... A61L 17/10 606/228 |
| 2014/0236286 A1 * | 8/2014 | Kirkpatrick ............... A61F 2/82 623/1.42 |
| 2014/0236295 A1 * | 8/2014 | Khoury ................... A61F 2/28 623/13.11 |
| 2014/0315271 A1 * | 10/2014 | Khoury ................... A61L 27/06 435/173.8 |
| 2014/0336125 A1 * | 11/2014 | Khoury ................... A61L 27/24 514/17.2 |
| 2015/0024020 A1 * | 1/2015 | Kirkpatrick ............... B05D 3/00 424/422 |
| 2015/0038899 A1 * | 2/2015 | Tarrant ................ A61F 2/30771 604/93.01 |
| 2015/0332924 A1 * | 11/2015 | Regan ............... H01L 21/26566 438/514 |
| 2015/0351892 A1 * | 12/2015 | Khoury ................... G21K 5/04 623/1.15 |
| 2015/0366044 A1 * | 12/2015 | Kirkpatrick ............. H05H 3/02 250/251 |

(56) References Cited

U.S. PATENT DOCUMENTS

2016/0004152 A1* 1/2016 Kirkpatrick .............. G03F 1/82
430/5

FOREIGN PATENT DOCUMENTS

| EP | 2088613 A1 | 8/2009 |
|---|---|---|
| JP | 62296357 A | 12/1987 |
| JP | 06275545 | 9/1994 |
| JP | 08-031369 | 2/1996 |
| JP | 2000-073936 A | 3/2000 |
| JP | 2003-532349 A | 10/2003 |
| JP | 2008-153199 A | 7/2008 |
| TW | 200901262 A | 1/2009 |
| WO | 0170378 A1 | 9/2001 |
| WO | 0183238 A1 | 11/2001 |
| WO | 0184612 A1 | 11/2001 |

OTHER PUBLICATIONS

Nguyen, S. V., High-density Plasma Chemical Vapor Deposition of Silicon-based Dielectric Films for Integrated Circuits, J. Res. Develop., Jan./Mar. 1999, pp. 109-126, vol. 43, No. 1/2.

Witvrouw et al., A Comparison Between Wet HF Etching and Vapor HF Etching for Sacrificial Oxide Removal, SPIE vol. 4174 (2000), pp. 130-141.

Shao et al. "Nitrogen gas-cluster ion beam—A new nitrogen source for GaN growth", Mat. Res. Soc. Symp. Proc., 2003, vol. 743, pp. 97-102.

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).

Saitoh, Y. et al., Acceleration of cluster and molecular ions by TIARA 3 MV tandem accelerator, vol. 452, No. 1-2, Sep. 21. 2000, pp. 61-66, XP004210610, ISSN: 0168-9002.

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

Baker, S.H. et al., The construction of a gas aggregation source for the preparation of size-selected nanoscale transition metal clusters; Review of Scientific Instruments, AIP, Aug. 1, 2000, pp. 3178-3183, vol. 71, No. 8, XP012038462, ISSN: 0034-6748, Melville, NY.

Toyoda, N. et al., High Quality Optical Thin Film Formation with Low Energy Gas Cluster Ion Beam Irradiation, 14th Int'l Conference on Ion Implantation Technology Proceedings, IEEE, 2003, pp. 701-704, Piscataway, NJ.

U.S. Patent and Trademark Office, Non-final Office Action issued in related U.S Appl. No. 12/145,199 dated Oct. 22, 2010, 25 pp.

Hautala, J. et al. "Infusion Processing: An Alternative to Plasma Technology for Semiconductor Device Manufacturing", Proceedings of the Electrochemical Society, Symposium on ULSI Process Integration IV (Quebec PR, Canada, May 16-20, 2005), 2005, vol. 6, pp. 118-130.

U.S. Patent and Trademark Office, Non-final Office Action issued in related U.S Appl. No. 12/145,199 dated Mar. 25, 2011, 16 pp.

U.S. Patent and Trademark Office, Non-final Office Action issued in related U.S Appl. No. 12/428,856 dated Apr. 27, 2011, 40 pp.

U.S. Patent and Trademark Office, Final Office Action issued in related US. Appl. No. 12/428,856 dated Nov. 1, 2011, 15 pp.

U.S. Patent and Trademark Office, Final Office Action issued in related US. Appl. No. 12/415,883 dated Jun. 13, 2012, 32 pp.

Japan Patent Office, Office Action issued in related JP Patent Application 2013-509215 mailed Sep. 16, 2014, including English translation, 6 pp.

Taiwan Patent Office, English translation of Office Action issued in related Taiwan Patent Application No. 099104376 dated Apr. 8, 2013, 5 pp.

Taiwan Intellectual Property Office, Notification of Examination Opinions issued in corresponding Taiwan Patent Application No. 099103188, including English translation, dated Apr. 9, 2013, 21 pp.

Taiwan Intellectual Property Office, Notification of Examination Opinions issued in related Taiwan Patent Application No. 099104376, including English translation, dated Apr. 8, 2013, 12 pp.

* cited by examiner

METHOD AND APPARATUS FOR BEAM DEFLECTION IN A GAS CLUSTER ION BEAM SYSTEM

CROSS-REFERENCE TO RELATED APPLICATIONS

Pursuant to 37 C.F.R. §1.78(a)(4), this application is based on and claims the benefit of and priority to U.S. Provisional Patent Application No. 61/993,007, entitled "METHOD AND APPARATUS FOR BEAM DEFLECTION IN A GAS CLUSTER IONBEAM SYSTEM" (Ref. No. EP-199-PROV), filed May 14, 2014. This application is related to U.S. Nonprovisional patent application Ser. No. 12/367,697, entitled "METHOD FOR FORMING TRENCH ISOLATION USING A GAS CLUSTER ION BEAM GROWTH PROCESS" (Ref. No. EP-154), filed on Feb. 9, 2009, now U.S. Pat. No. 7,968,422, issued on Jun. 28, 2011 and U.S. Provisional Patent Application No. 61/149,917, entitled "METHOD FOR FORMING TRENCH ISOLATION USING GAS CLUSTER ION BEAM PROCESSING" (Ref. No. EP-169 PROV), filed on Feb. 4, 2009. This application is also related to U.S. patent application Ser. No. 12/428,973 entitled "METHOD OF IRRADIATING SUBSTRATE WITH GAS CLUSTER ION BEAM FORMED FROM MULTIPLE GAS NOZZLES" (Ref. No. EP-172), now U.S. Pat. No. 8,304,033 issued on Nov. 6, 2012, and U.S. patent application Ser. No. 12/428,856 entitled "METHOD FOR FORMING TRENCH ISOLATION USING GAS CLUSTER ION BEAM PROCESSING" (Ref. No. EP-169), each filed on even date herewith. The entire contents of all of these applications are herein incorporated by reference in their entirety.

BACKGROUND OF THE INVENTION

Field of the Invention

The invention relates to a system for irradiating substrates using a gas cluster ion beam (GCIB), and a method for irradiating substrates to dope, grow, deposit, or modify layers on a substrate using one or more nozzles and specifically to irradiate a structure with GCIB using a narrow range of deflection angles while scanning the substrate.

Description of Related Art

Gas cluster ion beams (GCIB's) are used for doping, etching, cleaning, smoothing, and growing or depositing layers on a substrate. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion. The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high pressure gas from a nozzle into a vacuum. A gas skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, nitrous oxide, and mixtures of these gases. Several emerging applications for GCIB processing of substrates on an industrial scale are in the semiconductor field. Although GCIB processing of a substrate is performed using a wide variety of gas-cluster source gases, many of which are inert gases, many semiconductor processing applications use reactive source gases, sometimes in combination or mixture with inert or noble gases, to form the GCIB. Certain gas or gas mixture combinations are incompatible due to their reactivity, so a need exists for a GCIB system which overcomes the incompatibility problem.

In addition, deep features in semiconductor substrates require processing into vias or trenches. There is a need to process the material such that the result of the doping, growing, depositing, etching, cleaning, or modifying layers at the bottom in a trench, via, or a high aspect ratio structure is controlled or squared off instead of being rounded. With the increased density of structures, there is a need to precisely control the effect of GCIB on the target area of the structure.

SUMMARY OF THE INVENTION

Provided is a method of controlling a gas cluster ion beam (GCIB) system for processing structures on a substrate. A GCIB system comprises deflection plates for directing a GCIB towards a substrate, the GCIB system coupled to a substrate scanning device configured to move a substrate in three dimensions. The substrate is exposed to the GCIB while the substrate is being moved by the substrate scanning device. A controller is used to control a set of deflection operating parameters comprising a deflection angle $\phi$, voltage differential of the deflection plates, frequency of the deflection plate power, beam current, substrate distance d, pressure in the nozzle, gas flow rate in the process chamber, separation of beam burns, duration of the bean burn, and/or duty cycle of the beam deflector output.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 16A shows a 10 degree off-axis beam direction and an exemplary cross sectional image view of the structures irradiated with GCIB in an embodiment of the present invention while

FIG. 18A is an exemplary graph of the differential voltage in the deflection plates as a function of time at 1 KHz in one embodiment of the present invention whereas

FIG. 21A depicts exemplary beam burns images as a function of plate voltage differential while

DETAILED DESCRIPTION OF EXEMPLARY EMBODIMENTS

In the following description, in order to facilitate a thorough understanding of the invention and for purposes of explanation and not limitation, specific details are set forth, such as a particular geometry of the metrology system and descriptions of various components and processes. However, it should be understood that the invention may be practiced in other embodiments that depart from these specific details. FIG. 1, FIG. 2, FIG. 3, FIG. 4, FIG. 5, FIG. 6, FIG. 7, FIG. 8, FIG. 9, FIG. 10A, FIG. 10B, FIG. 10C, FIG. 11A, FIG. 11B, FIG. 12A, FIG. 12B, FIG. 13A, FIG. 13B, FIG. 13C, FIG. 13D, FIG. 14, and FIG. 15 relate to a multiple nozzle GCIB system.

FIG. 16A, FIG. 16B, FIG. 17A, FIG. 17B, FIG. 18A, FIG. 18B, FIG. 19, FIG. 20, FIG. 21A, FIG. 21B, FIG. 22, FIG. 23, FIG. 24, and FIG. 25 relate to a deflection system comprising a GCIB processing system that can utilize a single or a multiple nozzle GCIB system.

Figure 1:
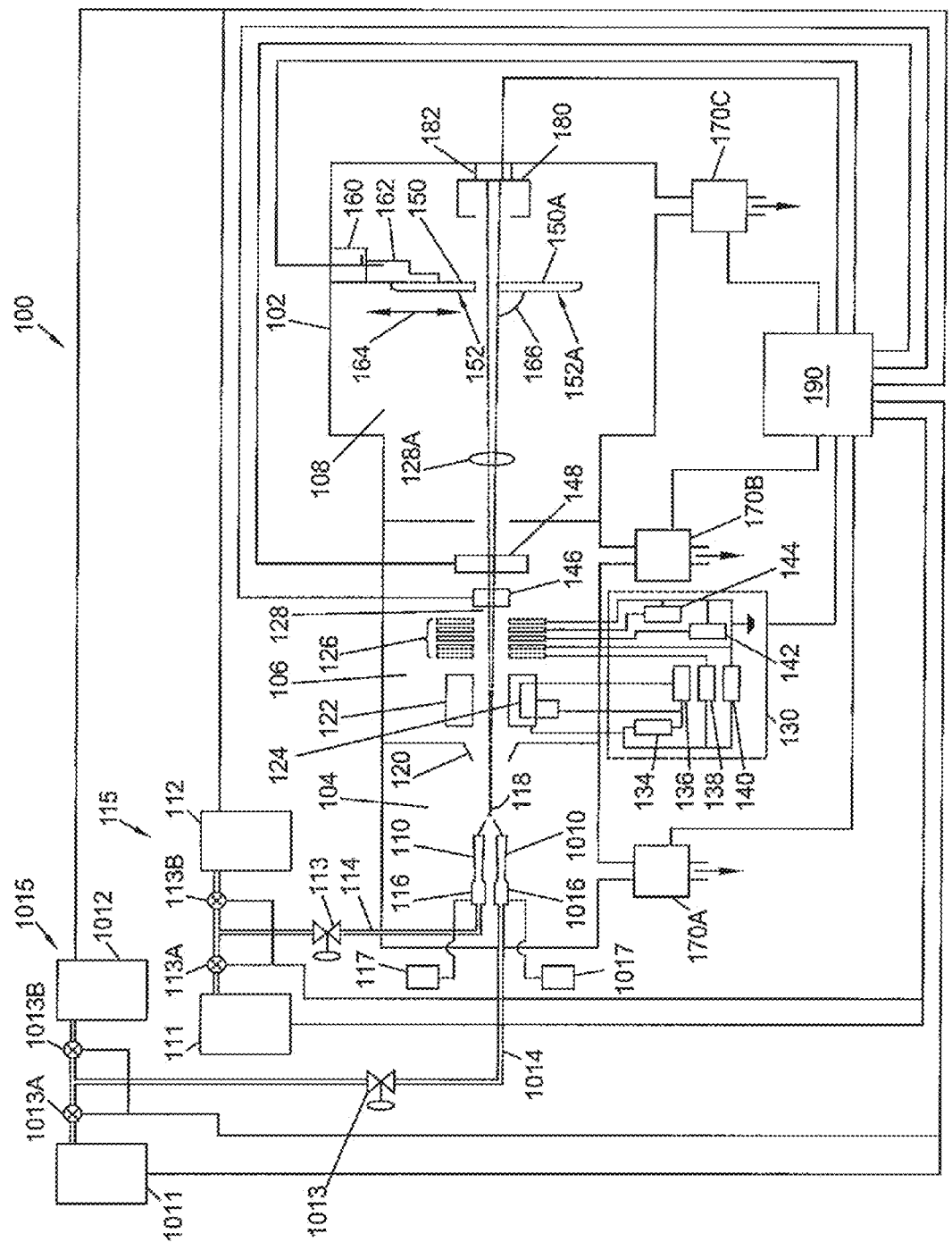
FIG. 1 is a schematic of a multiple nozzle GCIB system in accordance with an embodiment of the invention.

Referring now to FIG. 1, a GCIB processing system 100 for modifying, depositing, growing, or doping a layer is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

In the exemplary embodiment of FIG. 1, GCIB processing system 100 comprises two gas supplies 115, 1015 and two nozzles 116, 1016. Additional embodiments will be discussed later having numbers of nozzles different than two, and numbers of gas supplies different than two, all of which fall within the scope of the invention. Each of the two gas supplies 115 and 1015 is connected to one of two stagnation chambers 116 and 1016, and nozzles 110 and 1010, respectively. The first gas supply 115 comprises a first gas source 111, a second gas source 112, a first gas control valve 113A, a second gas control valve 113B, and a gas metering valve 113. For example, a first gas composition stored in the first gas source 111 is admitted under pressure through a first gas control valve 113A to the gas metering valve or valves 113. Additionally, for example, a second gas composition stored in the second gas source 112 is admitted under pressure through the second gas control valve 113B to the gas metering valve or valves 113. Further, for example, the first gas composition or second gas composition, or both, of first gas supply 115 can include a condensable inert gas, carrier gas or dilution gas. For example, the inert gas, carrier gas or dilution gas can include a noble gas, i.e., He, Ne, Ar, Kr, Xe, or Rn.

Similarly, the second gas supply 1015 comprises a first gas source 1011, a second gas source 1012, a first gas control valve 1013A, a second gas control valve 1013B, and a gas metering valve 1013. For example, a first gas composition stored in the first gas source 1011 is admitted under pressure through the first gas control valve 1013A to the gas metering valve or valves 1013. Additionally, for example, a second gas composition stored in the second gas source 1012 is admitted under pressure through the second gas control valve 1013B to the gas metering valve or valves 1013. Further, for example, the first gas composition or second gas composition, or both, of second gas supply 1015 can include a condensable inert gas, carrier gas or dilution gas. For example, the inert gas, carrier gas or dilution gas can include a noble gas, i.e., He, Ne, Ar, Kr, Xe, or Rn.

Furthermore, the first gas sources 111 and 1011, and the second gas sources 112 and 1012 are each utilized to produce ionized clusters. The material compositions of the first and second gas sources 111, 1011, 112, and 1012 include the principal atomic (or molecular) species, i.e., the first and second atomic constituents desired to be introduced for doping, depositing, modifying, or growing a layer.

The high pressure, condensable gas comprising the first gas composition and/or the second gas composition is introduced from the first gas supply 115 through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and a gas cluster beam emanates from nozzle 110.

Similarly, the high pressure, condensable gas comprising the first gas composition and/or the second gas composition is introduced from the second gas supply 1015 through gas feed tube 1014 into stagnation chamber 1016 and is ejected into the substantially lower pressure vacuum through a properly shaped nozzle 1010. As a result of the expansion of the high pressure, condensable gas from the stagnation chamber 1016 to the lower pressure region of the source chamber 104, the gas velocity accelerates to supersonic speeds and a gas cluster beam emanates from nozzle 1010.

Nozzles 110 and 1010 are mounted in such close proximity that the individual gas cluster beams generated by the nozzles 110, 1010 substantially coalesce in the vacuum environment of source chamber 104 into a single gas cluster beam 118 before reaching the gas skimmer 120. The chemical composition of the gas cluster beam 118 represents a mixture of compositions provided by the first and second gas supplies 115 and 1015, injected via nozzles 110 and 1010.

The inherent cooling of the jet as static enthalpy is exchanged for kinetic energy, which results from the expansion in the jets, causes a portion of the gas jets to condense and form a gas cluster beam 118 having clusters, each consisting of from several to several thousand weakly bound atoms or molecules. A gas skimmer 120, positioned downstream from the exit of nozzles 110 and 1010 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

The first and second gas supplies 115 and 1015 can be configured to independently control stagnation pressures and temperatures of gas mixtures introduced to stagnation chambers 116 and 1016. Temperature control can be achieved by the use of suitable temperature control systems (e.g. heaters and/or coolers) in each gas supply (not shown). In addition, a manipulator 117 may be mechanically coupled to nozzle 110, for example via the stagnation chamber 116, the manipulator 117 being configured to position the coupled nozzle 110 with respect to the gas skimmer 120, independent of nozzle 1010. Likewise, a manipulator 1017 may be mechanically coupled to nozzle 1010, for example via the stagnation chamber 1016, the manipulator 1017 being configured to position the coupled nozzle 1010 with respect to the gas skimmer 120, independent of nozzle 110. Thus each nozzle in a multi-nozzle assembly may be separately manipulated for proper positioning vis-à-vis the single gas skimmer 120.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 1, the beam electronics 130 further include an anode power supply 134 that provides voltage $V_A$ to an anode of ionizer 122 for accelerating electrons emitted from ionizer filament 124 and causing the electrons to bombard the gas clusters in gas cluster beam 118, which produces cluster ions.

Additionally, as illustrated in FIG. 1, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{ACC}$ to bias one of the high voltage electrodes 126 with respect to the ionizer 122 so as to result in a total GCIB acceleration energy equal to about $V_{ACC}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{ACC}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter 146 may comprise a magnet assembly for imposing a magnetic field across the GCIB 128 to aid in the filtering process.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 1, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 2:
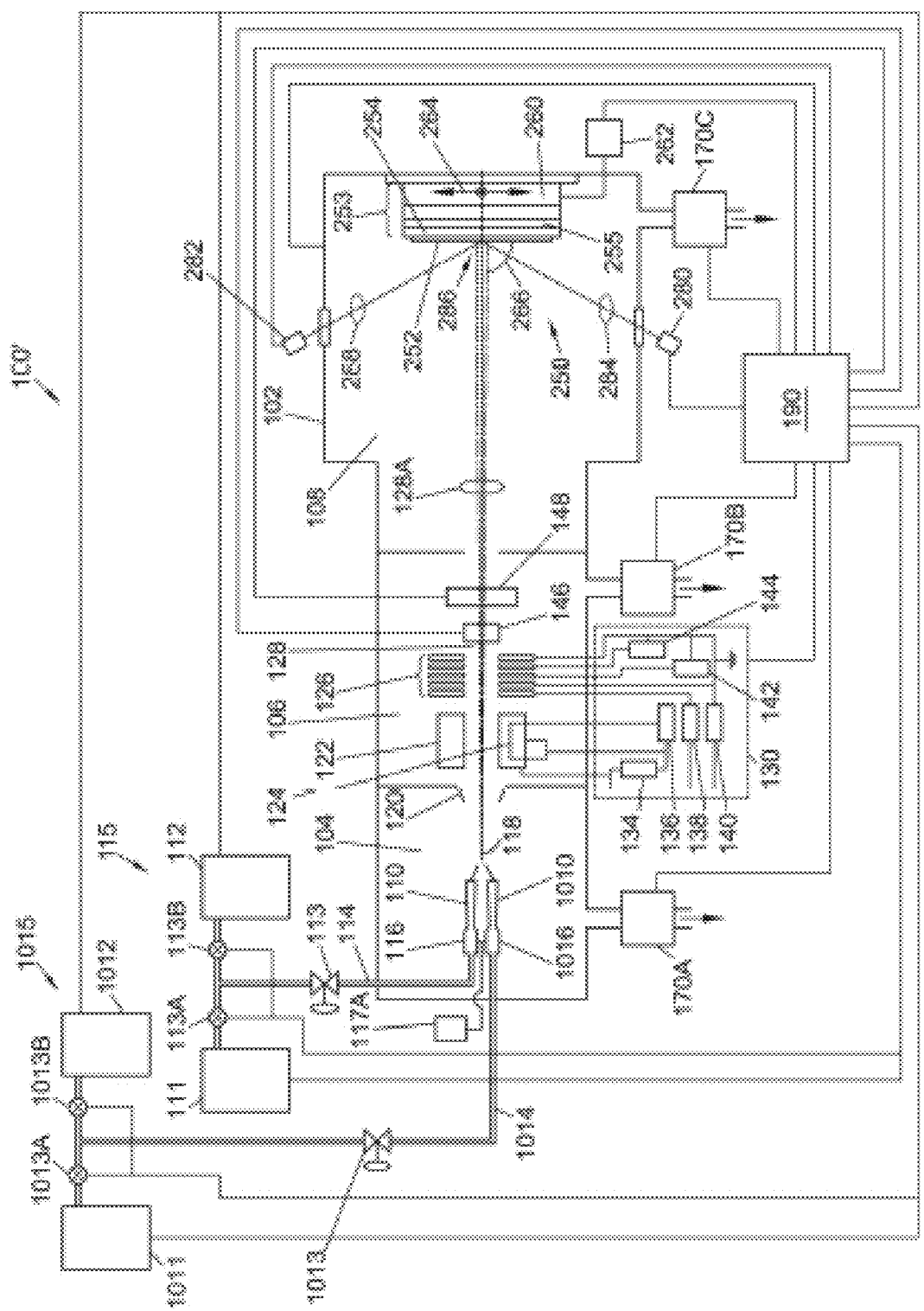
FIG. 2 is a schematic of a multiple nozzle GCIB system in accordance with another embodiment of the invention.

In the embodiment shown in FIG. 2, the GCIB processing system 100' can be similar to the embodiment of FIG. 1 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 1) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 3:
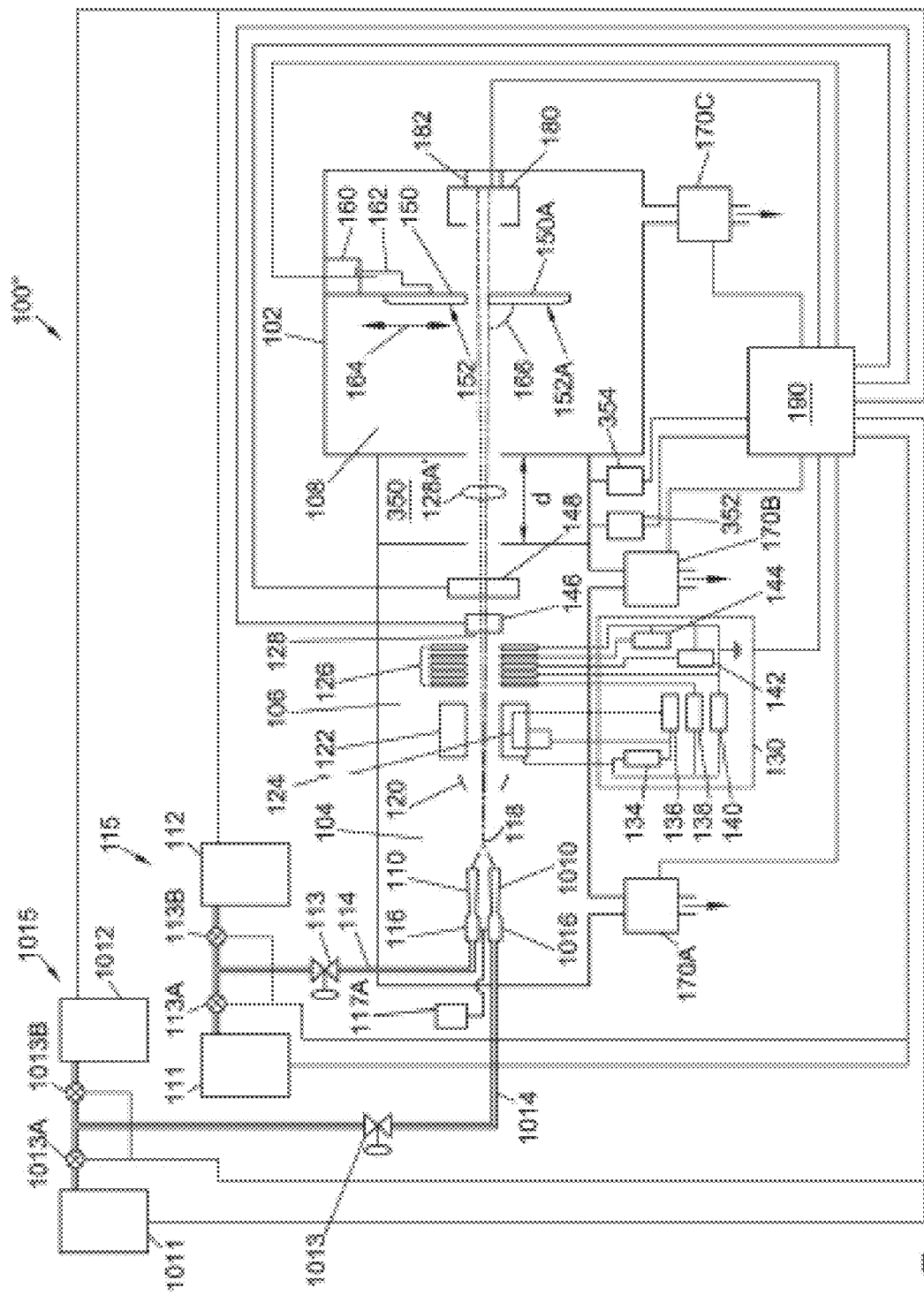
FIG. 3 is a schematic of a multiple nozzle GCIB system in accordance with yet another embodiment of the invention.

In the embodiment shown in FIG. 3, the GCIB processing system 100" can be similar to the embodiment of FIG. 1 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled METHOD AND APPARATUS FOR IMPROVED PROCESSING WITH A GAS-CLUSTER ION BEAM; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas sources 111 and 1011, second gas sources 112 and 1012, first gas control valves 113A and 1013A, second gas control valves 113B and 1013B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Also shown in FIGS. 2 and 3 is an alternative embodiment for a nozzle manipulator. Rather than each nozzle 110, 1010 being coupled to a separately operable manipulator 117, 1017 as in FIG. 1, the nozzles 110, 1010 may be coupled to each other, and together coupled to a single manipulator 117A. The position of the nozzles 110, 1010 vis-à-vis the gas skimmer 120 can then be manipulated collectively as a set rather than individually.

Figure 4:
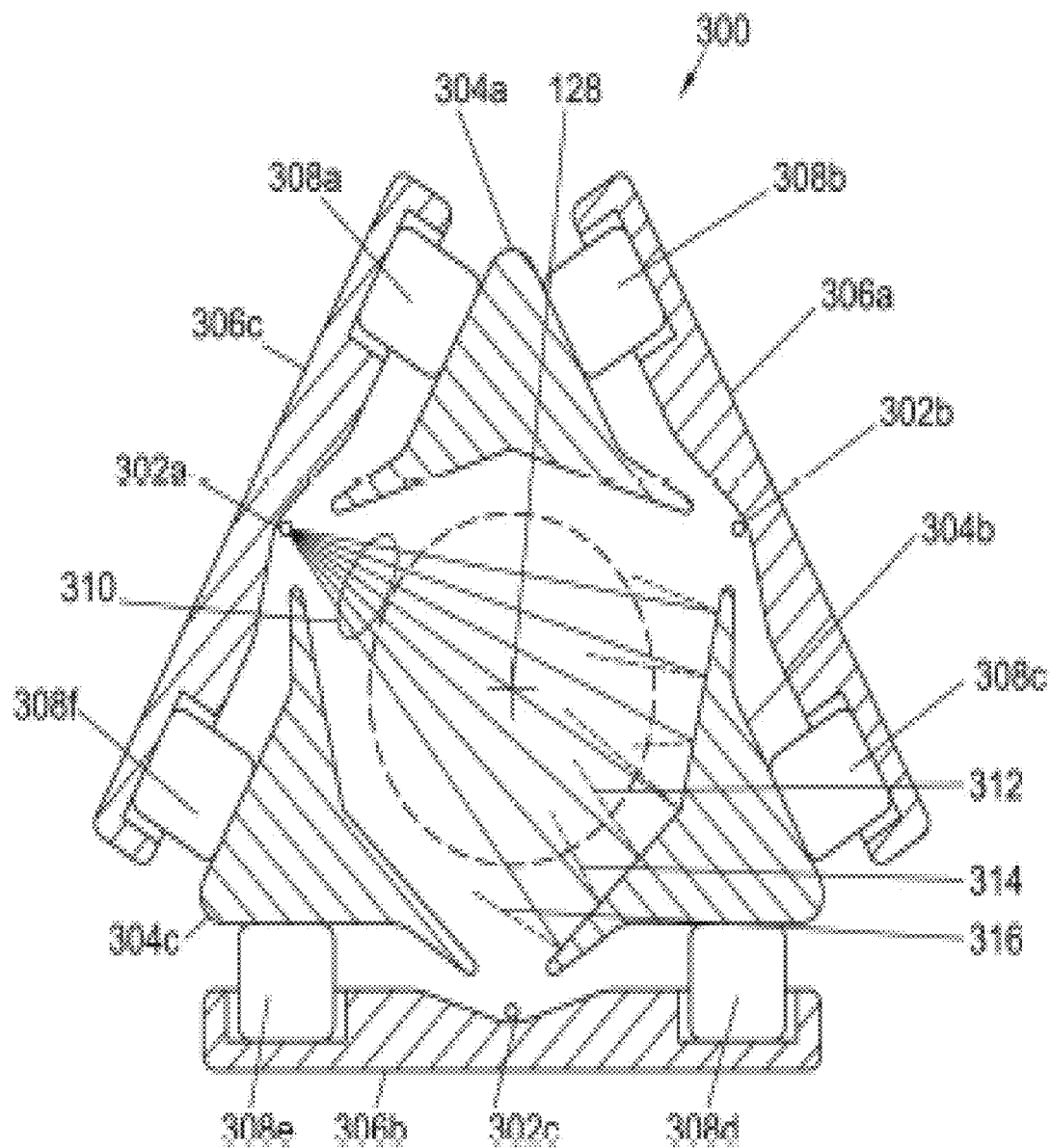
FIG. 4 is a schematic of an embodiment of an ionizer for use in a GCIB system.

Referring now to FIG. 4, a section 300 of a gas cluster ionizer (122, FIGS. 1, 2 and 3) for ionizing a gas cluster jet (gas cluster beam 118, FIGS. 1, 2 and 3) is shown. The section 300 is normal to the axis of GCIB 128. For typical gas cluster sizes (2000 to 15000 atoms), clusters leaving the gas skimmer aperture (120, FIGS. 1, 2 and 3) and entering an ionizer (122, FIGS. 1, 2 and 3) will travel with a kinetic energy of about 130 to 1000 electron volts (eV). At these low energies, any departure from space charge neutrality within the ionizer 122 will result in a rapid dispersion of the jet with a significant loss of beam current. FIG. 4 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar. For example, the ionizer design may be similar to the ionizer described in U.S. Pat. No. 7,173,252, entitled IONIZER AND METHOD FOR GAS-CLUSTER ION-BEAM FORMATION; the content of which is incorporated herein by reference in its entirety.

The gas cluster ionizer (122, FIGS. 1, 2 and 3) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Figure 5:
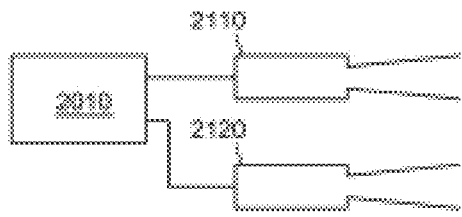
FIGS. 5-9 are schematics of various embodiments of the multiple nozzle assembly, comprising multiple nozzles, single or multiple gas supplies, and having various gas flow interconnections provided therebetween.

With reference now to FIGS. 5-9, therein are depicted various embodiments of the multiple nozzle and gas supply assembly of GCIB processing system 100 (or 100', 100") of FIGS. 1, 2, and 3, respectively. FIG. 5 depicts an embodiment of a multiple nozzle and gas supply assembly comprising a single gas supply 2010 and two nozzles 2110 and 2120, fed by gas supply 2010. Like, for example, the first gas supply 115 of GCIB processing system 100 of FIG. 1, gas supply 2010 (and all other gas supplies of FIGS. 5-9) may comprise a first gas source, a second gas source, a first gas control valve, a second gas control valve, and a gas metering valve to allow the formation of a gas mixture composed of gases provided by the first and second gas sources, or alternatively to flow only one gas from the first or second gas source. The multiple nozzle and gas supply assembly of FIG. 5 is suitable for GCIB applications where a large gas flow is required of a single gas or gas mixture, necessitating the use of multiple nozzles, so identical or similar stagnation conditions (i.e. pressure and temperature) can be maintained inside stagnation chambers preceding the nozzles, and identical or similarly-sized nozzles can be utilized as those in a prior art single gas supply and single nozzle GCIB system.

Figure 6:
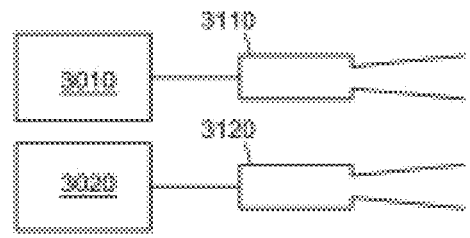

FIG. 6 depicts essentially the embodiment of the multiple nozzle and gas supply assembly of GCIB processing system 100 (or 100', 100") of FIGS. 1, 2, and 3, respectively. The assembly of FIG. 6 comprises two gas supplies 3010 and 3020, and two gas nozzles 3110 and 3120, allowing its use in GCIB applications requiring the formation of gas cluster beams composed of mixtures of incompatible gases and/or pyrophoric gases. Such incompatible gas mixtures cannot be readily premixed in a single gas supply (e.g. gas supply 2010 of FIG. 5) for injection via a single or multiple nozzles, due to at least adverse chemical reactions that would occur between the incompatible gas mixture components inside the parts and piping of the single gas supply. The multiple nozzle and gas supply assembly of FIG. 6 overcomes this issue by providing independent gas supplies 3010, 3020 for the incompatible and/or pyrophoric gas mixture components, which are only mixed upon injection from nozzles 3110 and 3120 mounted in mutual close proximity so as to at least partially coalesce and produce a single gas cluster beam. A further advantage is that different dilution gases may be used in the different gas mixtures, for example, a first gas mixture may use He as a dilution gas, while a second gas mixture may use Ar. It is also possible to configure gas supplies 3010 and 3020 of the multiple nozzle and gas supply system of FIG. 6 to flow gas mixtures of the same composition to nozzles 3110 and 3120. Furthermore, the multiple nozzle and gas supply assembly of FIG. 6 allows the injection of gas mixtures at different stagnation pressures and/or temperatures, from nozzles 3110 and 3120, for example, if optimum cluster nucleation conditions of gas mixtures are different, and therefore require different stagnation conditions. Stagnation pressure control is achieved generally by setting the gas metering valve of a gas supply, while stagnation temperature control may be achieved by the use of suitable heaters or cooling devices (not shown).

Figure 7:
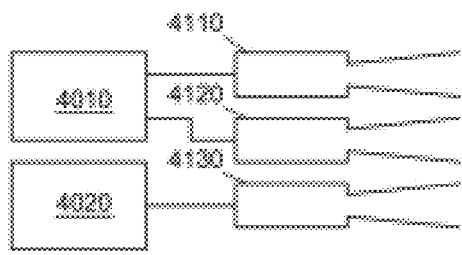
Figure 8:
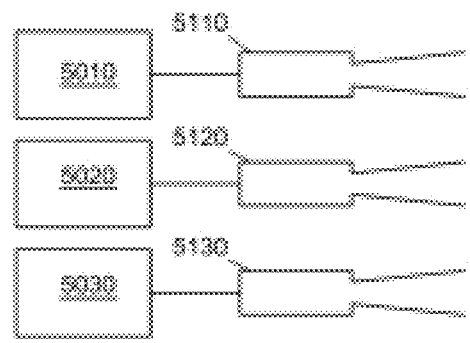
Figure 9:
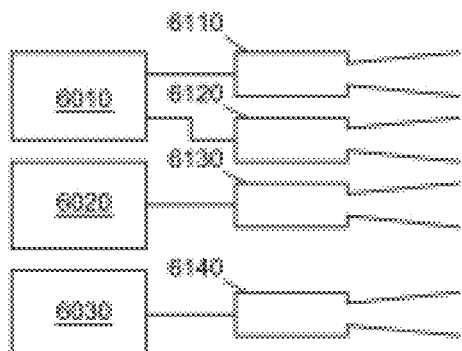

FIG. 7 depicts a multiple nozzle and gas supply assembly similar to that of FIGS. 5 and 6 combined, comprising gas supplies 4010 and 4020, and three nozzles 4110, 4120, and 4130, wherein gas supply 4010 supplies two nozzles, 4110 and 4120 respectively, allowing higher flow rates of one gas mixture, while gas supply 4020 supplies only nozzle 4130. This configuration is suitable for applications requiring high flow rates of one gas mixture component, while retaining the ability to handle incompatible and/or pyrophoric gases. FIG. 8 depicts a similar embodiment to that of FIG. 6, extended to comprise three gas supplies 5010, 5020, and 5030, and three nozzles 5110, 5120, and 5130, allowing independent introduction of three different gas mixtures to the nozzles, if a GCIB process so requires. FIG. 9 depicts a similar assembly to that of FIGS. 5 and 8 combined, comprising three gas supplies 6010, 6020, and 6030, and four nozzles 6110, 6120, 6130, and 6140, wherein gas supply 6010 is connected to nozzles 6110 and 6120, allowing high gas mixture flow rates therethrough, with the ability to independently provide an additional two gas mixture components.

While embodiments of FIGS. 5-9 can, as process conditions may demand, be set to simultaneously flow multiple gases or gas mixtures to the individual nozzles, it is also possible to operate the multiple gas supplies and nozzles in a sequential manner, wherein in a sequence of process steps, at least one step is used that involves simultaneously flowing multiple gases or gas mixtures. For example, in the embodiment of FIG. 6, a first GCIB process step may involve flowing only a single gas or gas mixture, generated by gas supply 3010, and introduced via nozzle 3110, and a second process step may involve first and second gases or gas mixtures, generated by gas supplies 3010 and 3020, and introduced via nozzles 3110 and 3120, respectively.

It is immediately apparent that other embodiments of the multiple nozzle and gas supply assembly are possible, comprising different numbers of nozzles (e.g. higher than four), and different numbers of gas supplies (e.g. higher than three) some of which may be connected to multiple nozzles to accommodate high flow rates, all of which embodiments fall within the scope of the invention.

FIGS. 10A-12B are cross-sectional schematics depicting various spatial arrangements of multiple nozzles, and various cross-sectional shapes of a single gas skimmer to be used with a particular nozzle arrangement. The mutual close proximity of nozzles within the assembly ensure that the individual gas cluster beams leaving the nozzles substantially or at least partially coalesce into a single gas cluster beam before reaching the gas skimmer. The coalescence of gas cluster beams into a single gas cluster beam before reaching the gas skimmer allows the use of same GCIB system components downstream of the gas skimmer as in a prior art single gas supply and single nozzle GCIB system. Given that these downstream components may be the same, it is envisioned that an existing GCIB system can be converted into a multi-nozzle system, with multiple gas supplies, with relatively little modification and/or parts replacement, primarily in the source chamber area of a GCIB system.

Figure 10A:
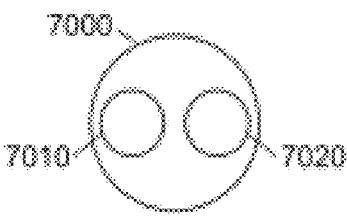
FIGS. 10A-12B are cross-sectional views of various embodiments of the multiple nozzle assembly depicting various arrangements of multiple nozzles, and having various gas skimmer cross-sectional shapes to accommodate the various nozzle arrangements.
Figure 10B:
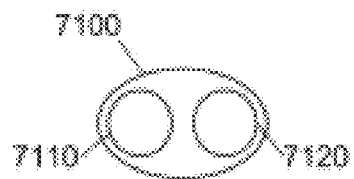
Figure 10C:
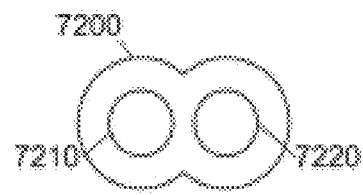
Figure 11A:
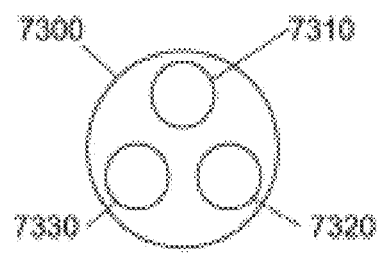
Figure 11B:
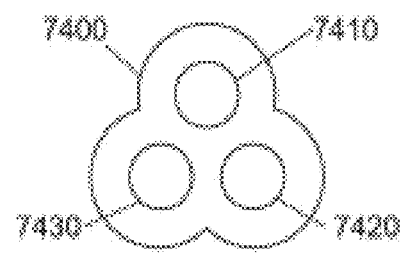
Figure 12A:
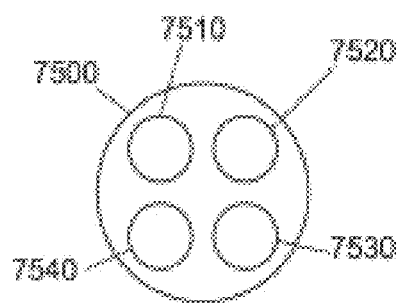
Figure 12B:
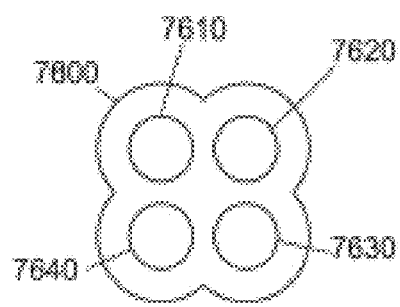

FIG. 10A depicts a multiple nozzle assembly comprising two nozzles 7010 and 7020, seen in cross section, mounted side by side (or alternatively oriented vertically one above the other) forming a gas cluster beam which passes through a gas skimmer 7000 of substantially circular cross section. FIG. 10B depicts a similar dual nozzle assembly with an oval or elliptical gas skimmer 7100, aligned with nozzles 7110 and 7120. FIG. 10C depicts a dual nozzle assembly with a twin lobed gas skimmer 7200, aligned with nozzles 7210 and 7220. The embodiments of FIGS. 10A-C can readily be extended to assemblies with larger numbers of nozzles. For example, FIG. 11A depicts an assembly with three nozzles 7310, 7320, and 7330 injecting a gas cluster beam through a substantially circular gas skimmer 7300. FIG. 11B depicts a similar three-nozzle assembly, but with a three-lobed gas skimmer 7400, aligned with the nozzles 7410, 7420, and 7430. In similar vein, FIGS. 12A-B extend the concept to an assembly with four nozzles 7510, 7520, 7530 and 7540, and four nozzles 7610, 7620, 7630 and 7640, respectively, injecting a gas cluster beam through a substantially circular gas skimmer 7500 and four-lobed gas skimmer, 7600, respectively. Other embodiments can be readily envisioned, all of which fall within the scope of the invention.

Figure 13A:
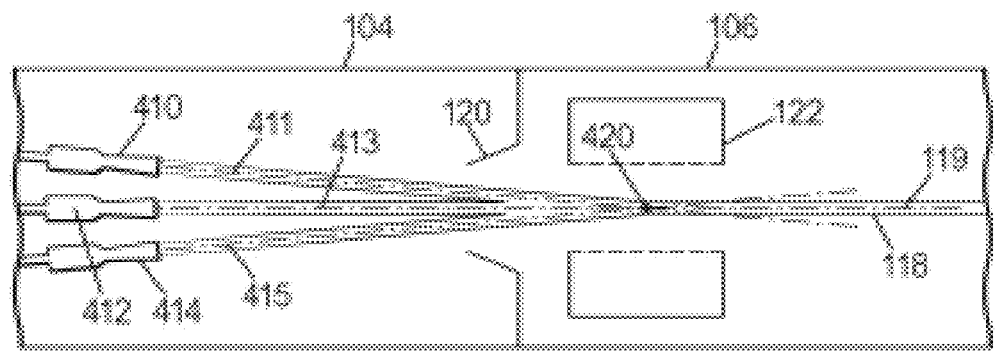
FIG. 13A-D are schematics of various embodiments of a multiple nozzle assemblies with nozzles mounted at an inwards pointing angle such that gas cluster beams intersect at a point along the main GCIB axis.
Figure 13B:
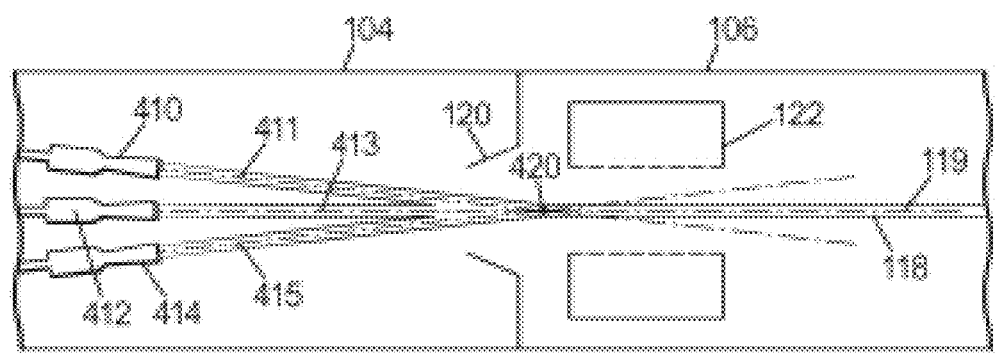
Figure 13C:
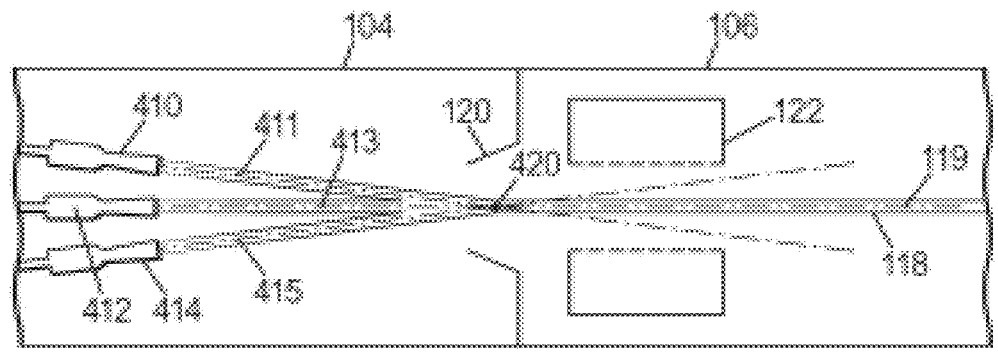
Figure 13D:
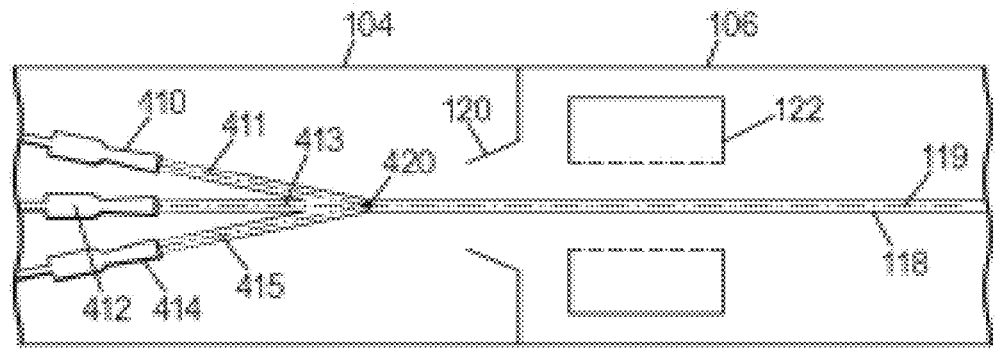

Furthermore, as depicted in partial schematic view in FIGS. 13A-13D, to assist in gas cluster beam coalescence, the nozzles (three nozzles 410, 412, 414 are shown, but the invention is not so limited) can be mounted at a slight angle pointing towards a single intersecting point 420 along the beam axis 119 of gas cluster beam 118 of FIGS. 1, 2 and 3. For example, the gas cluster beam axes 411, 413, 415 of the individual nozzles 410, 412, 414 can intersect at a single intersecting point 420 along beam axis 119 inside the ionizer 122 (e.g., of GCIB processing system 100 of FIG. 1), as depicted in FIG. 13A. Alternatively, the gas cluster beam axes 411, 413, 415 of the individual nozzles 410, 412, 414 can intersect at a single intersecting point 420 along beam axis 119 downstream of the gas skimmer 120 but upstream of the ionizer 122, as depicted in FIG. 13B. In another alternative, the gas cluster beam axes 411, 413, 415 of the individual nozzles 410, 412, 414 can intersect at a single intersecting point 420 along beam axis 119 between an input and an output of the gas skimmer 120, as depicted in FIG. 13C. Alternatively yet, the gas cluster beam axes 411, 413, 415 of the individual nozzles 410, 412, 414 can intersect at a single intersecting point 420 along beam axis 119 between the output of the nozzles 410, 412, 414 and the input of the gas skimmer 120, as depicted in FIG. 13D. The inward slant angle, i.e. deviation from parallel orientation, can range from 0.5 to 10 degrees or from 0.5 to 5 degrees or from 1 to 2 degrees.

Figure 14:
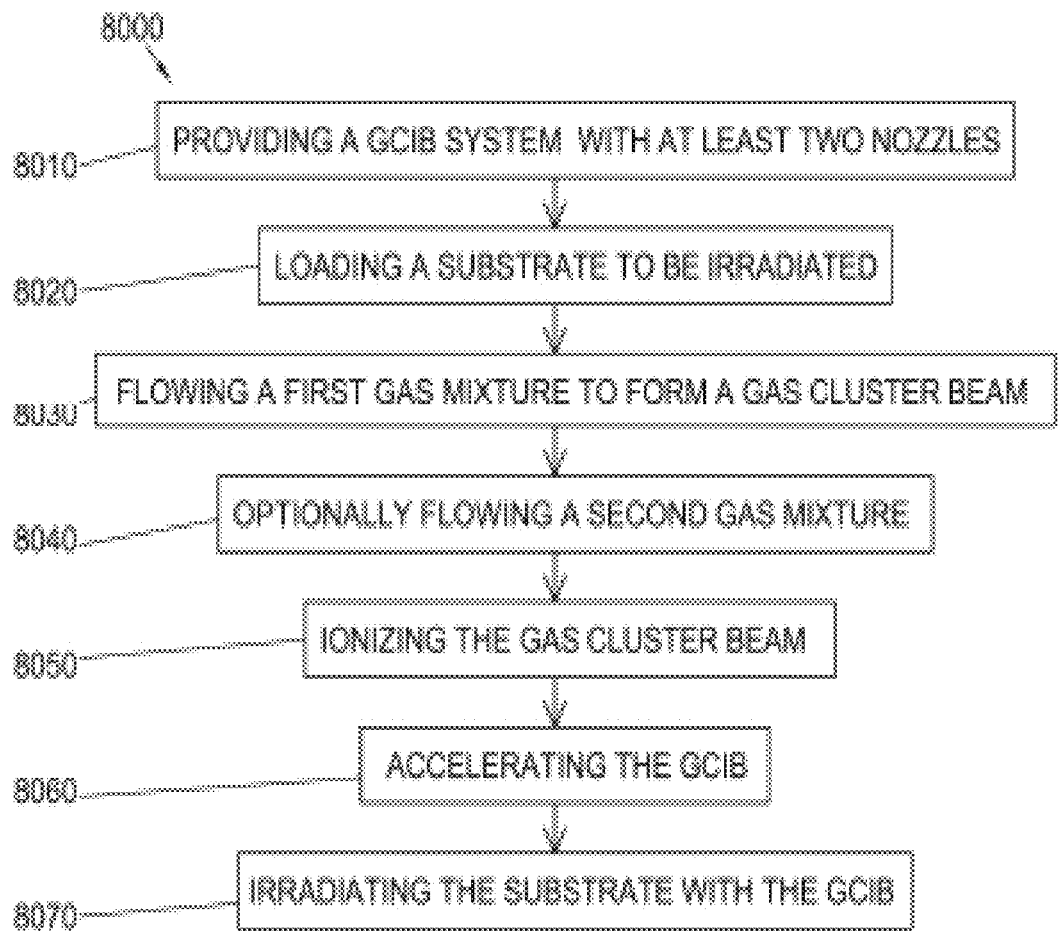
FIG. 14 is a flowchart of an embodiment of a method for operating a GCIB system with multiple nozzles.

Referring now to FIG. 14, a method of irradiating a substrate using a GCIB is illustrated according to an embodiment. The method comprises a flow chart 8000 beginning in 8010 with providing a GCIB processing system with a set of at least two nozzles either arranged in mutual close proximity to ensure coalescence of individual gas cluster beams before reaching a single gas skimmer or arranged so as to have intersecting beam axes, and a first gas supply configured to supply at least a subset of the full set of nozzles (e.g. a single nozzle, or multiple nozzles of the subset) with a gas mixture. The GCIB processing system can be any of the GCIB processing systems (100, 100' or 100") described above in FIG. 1, 2 or 3, or any combination thereof, with any arrangement of nozzles and gas supplies shown in FIGS. 5-13D.

In step 8020, a substrate is loaded into the GCIB processing system. The substrate can include a conductive material, a non-conductive material, or a semi-conductive material, or a combination of two or more thereof. Additionally, the substrate may include one or more material structures formed thereon, or the substrate may be a blanket substrate free of material structures. The substrate can be positioned in the GCIB processing system on a substrate holder and may be securely held by the substrate holder. The temperature of the substrate may or may not be controlled. For example, the substrate may be heated or cooled during a film forming process. The environment surrounding the substrate is maintained at a reduced pressure.

In step 8030, a flow of a first gas mixture is started from the first gas supply. The flow of gas through the nozzle, all nozzles, or subset of nozzles connected to the first gas supply forms a gas cluster beam or a coalesced and/or intersected gas cluster beam, which single beam passes through the single gas skimmer into the ionization chamber of the GCIB processing system.

In step 8040, an optional second gas mixture is introduced from an optional second gas supply into all or a subset of the remaining nozzles (i.e. nozzles not supplied by the first gas supply of step 8010, with the first gas mixture of step 8030). The optional second gas mixture may be the same or different than the first gas mixture, and the gas mixtures, if different, may be incompatible. Additionally, one of the gas mixtures may be pyrophoric. The optional second gas mixture also forms a gas cluster beam or beams that coalesces and/or intersects with the beam or beams from the first nozzle or subset of nozzles to form a single gas cluster beam.

In step 8050, the single gas cluster beam is ionized in an ionizer, such as, for example, ionizer 300 of FIG. 4, to form a gas cluster ion beam (GCIB). In step 8060, the GCIB is accelerated by applying a beam acceleration potential to the GCIB.

In step 8070, the GCIB composed of the first gas mixture, and the optional second gas mixture, is used to irradiate the substrate loaded in the GCIB processing system.

The beam acceleration potential and the beam dose can be selected to achieve the desired properties of a layer affected by irradiation with the GCIB, on the substrate. For example, the beam acceleration potential and the beam dose can be selected to control the desired thickness of a deposited or grown layer, or to achieve a desired surface roughness or other modification of an upper layer atop the substrate, or to control the concentration and depth of penetration of a dopant into the substrate. Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters irradiate the surface of the substrate per unit area (i.e., number of clusters per unit area per unit time) may be held constant while the time is varied to change the beam dose.

Additionally, other GCIB properties may be varied, including, but not limited to, gas flow rates, stagnation pressures, cluster size, or gas nozzle designs (such as nozzle throat diameter, nozzle length, and/or nozzle divergent section half-angle).

The selection of combinations of gases used for the first and optional second gas mixture depends on the process that the substrate is being subjected to. The deposition or growth of a material layer may include depositing or growing a $SiO_x$, $SiN_x$, $SiC_x$, $SiC_xO_y$, $SiC_xN_y$, $BN_x$, $BSi_xN_y$, Ge, SiGe (B), or SiC(P) layer on a substrate or atop an existing layer on a substrate. According to embodiments of the invention, the first or the optional second gas mixture may thus comprise a nitrogen-containing gas, a carbon-containing gas, a boron-containing gas, a silicon-containing gas, a phosphorous-containing gas, a sulfur-containing gas, a hydrogen-containing gas, a silicon-containing gas, or a germanium-containing gas, or a combination of two or more thereof. Examples of gases which may be used to form the first and optional second gas mixture are: He, Ne, Ar, Kr, Xe, Rn, $SiH_4$, $Si_2H_6$, $C_4H_{12}Si$, $C_3H_{10}Si$, $H_3C$—$SiH_3$, $H_3C$—$SiH_2$—$CH_3$, $(CH_3)_3$—$SiH$, $(CH_3)_4$—$Si$, $SiH_2Cl_2$, $SiCl_3H$, $SiCl_4$, $SiF_4$, $O_2$, CO, $CO_2$, $N_2$, NO, $NO_2$, $N_2O$, $NH_3$, $NF_3$, $B_2H_6$, alkyl silane, an alkane silane, an alkene silane, an alkyne silane, and $C_xH_y$, where $x \geq 1$, and $y \geq 4$, and combinations of two or more thereof. The first and optional second gas mixtures are formed by the first and optional second gas supplies of the GCIB processing system.

When depositing silicon, a substrate may be irradiated by a GCIB formed from a first or optional second gas mixture having a silicon-containing gas. For example, a gas mixture may comprise silane ($SiH_4$). In another example, the gas mixture may comprise disilane ($Si_2H_6$), dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), silicon tetrafluoride ($SiF_4$), or a combination of two or more thereof.

When depositing or growing an oxide such as $SiO_x$, a substrate may be irradiated by a GCIB formed from a first and optional second gas mixture having a silicon-containing gas and an oxygen-containing gas, respectively. For example, the first gas mixture may comprise silane ($SiH_4$), and the second gas mixture may comprise $O_2$. In another example, the second gas mixture may comprise $O_2$, CO, $CO_2$, NO, $NO_2$, or $N_2O$, or any combination of two or more thereof.

When depositing or growing a nitride such as $SiN_x$, a substrate may be irradiated by a GCIB formed from a first and optional second gas mixture having a silicon-containing gas and a nitrogen-containing gas, respectively. For example, the first gas mixture may comprise silane ($SiH_4$), and the second gas mixture may comprise $N_2$. In another example, the second gas mixture may comprise $N_2$, NO, $NO_2$, $N_2O$, or $NH_3$, or any combination of two or more thereof.

When depositing a carbide such as $SiC_x$, a substrate may be irradiated by a GCIB formed from a pressurized gas mixture having a silicon-containing gas and a carbon-containing gas. For example, the first gas mixture may comprise silane ($SiH_4$) and $CH_4$. Alternatively, the first gas mixture may comprise silane ($SiH_4$) only, and the optional second gas mixture may comprise $CH_4$. Additionally, for example, the first gas mixture may comprise silane ($SiH_4$), and the optional second gas mixture may comprise methylsilane ($H_3C$—$SiH_3$). Furthermore, for example, the first gas mixture may comprise a silicon-containing gas and $CH_4$ (or more generally a hydrocarbon gas, i.e., $C_xH_y$), and the optional second gas mixture may comprise CO, or $CO_2$. Further yet, any of the first gas mixture and optional second gas mixture may comprise, for example, alkyl silane, an alkane silane, an alkene silane, or an alkyne silane, or any combination of two or more thereof. Additionally, for example, the first gas mixture may comprise silane, methylsilane ($H_3C$—$SiH_3$), dimethylsilane ($H_3C$—$SiH_2$—$CH_3$), trimethylsilane (($CH_3$)$_3$—SiH), or tetramethylsilane (($CH_3$)$_4$—Si), or any combination of two or more thereof. When growing or depositing a carbonitride such as $SiC_xN_y$, the optional second gas mixture may further comprise a nitrogen-containing gas. For example, the nitrogen-containing gas may include $N_2$, $NH_3$, $NF_3$, NO, $N_2O$, or $NO_2$, or a combination of two or more thereof. The addition of a nitrogen-containing gas may permit forming a silicon carbonitride film (SiCN).

When growing or depositing a nitride such as $BN_x$, a substrate may be irradiated by a GCIB formed from a first gas mixture having a boron-containing gas and an optional second gas mixture having a nitrogen-containing gas. For example, the first gas mixture may comprise diborane ($B_2H_6$), and the optional second gas mixture may comprise $N_2$. In another example, the optional second gas mixture may comprise $N_2$, NO, $NO_2$, $N_2O$, or $NH_3$, or any combination of two or more thereof.

When growing or depositing a nitride such as $BSi_xN_y$, a substrate may be irradiated by a GCIB formed from a first gas mixture having a silicon-containing gas, and an optional second gas mixture having a boron-containing gas and a nitrogen-containing gas. For example, the first gas mixture may comprise silane ($SiH_4$), and the optional second gas mixture may comprise diborane ($B_2H_6$) and $N_2$. In another example, the optional second gas mixture may comprise $B_2H_6$, $N_2$, NO, $NO_2$, $N_2O$, or $NH_3$, or any combination of two or more thereof.

In other processes, such as for example, infusion, doping, and layer surface modification, in addition to layer growth and deposition, further additional gases may be used to form gas mixtures in gas supplies of a GCIB processing system. These gases include germanium-, phosphorus-, and arsenic-containing gases, such as $GeH_4$, $Ge_2H_6$, $GeH_2Cl_2$, $GeCl_3H$, methylgermane, dimethylgermane, trimethylgermane, tetramethylgermane, ethylgermane, diethylgermane, triethylgermane, tetraethylgermane, $GeCl_4$, $GeF_4$, $BF_3$, $AsH_3$, $AsF_5$, $PH_3$, $PF_3$, $PCl_3$, or $PF_5$, or any combination of two or more thereof.

In any one of the above examples, the first and/or second gas mixture may comprise an optional inert dilution gas. The dilution gas may comprise a noble gas, such as for example, He, Ne, Ar, Kr, Xe, or Rn, which may be different for the first and second gas mixtures.

Further extending the above process, optional third, fourth, etc., gas mixtures may be introduced (not shown), as the process may require, and if the number of available gas supplies and nozzles installed in the GCIB system, permits.

The inventors have tested the multiple nozzle GCIB system in a $SiO_2$ deposition process, which may be utilized for blanket $SiO_2$ deposition, or trench filling, such as shallow trench isolation (STI) structure filling. A similar process may be employed also for growth of a $SiO_2$ film. The hardware comprised a dual nozzle GCIB system configured with a pressure cell chamber, as in FIG. 3, with two gas supplies. The gas supply configuration of the GCIB system was that of FIG. 6. Each gas supply was configured with two gas sources: a first gas source for the process gas, and a second gas source for a dilution gas. The nozzle configuration used was that depicted in FIG. 10A, with nozzles mounted one above the other, and with a gas skimmer of circular cross section. All other components of the GCIB system were that of a single nozzle, single gas supply GCIB system.

To deposit $SiO_2$ on a substrate, the first gas supply was configured to flow $SiH_4$ as a Si-containing gas, which was diluted with He to form a first gas mixture fed into the first nozzle. The total flow rate through the first nozzle was set within the range of 300 to 700 sccm, typically 600 sccm, but the flow rate in a production process may be higher or lower than the above range, e.g. 200 to 1000 sccm. The percentage of $SiH_4$ in He, in the first gas mixture, was typically set at 10%, but in a production process it may be set higher or lower than 10%, e.g. at 2 to 20%. The second gas supply was configured to flow $O_2$ as an O-containing gas, through the second nozzle, at a flow rate ranging from 200 to 500 sccm, and optionally diluted with an additional flow of He ranging from 800 to 1100 sccm, to form a second gas mixture. In an actual production process, the flow rates of $O_2$ and the optional dilution gas may be different. The above flow rate ranges for the two gas mixtures translate into an $O_2/SiH_4$ ratio ranging from 3.3 to 16.7, which in part determines the $SiO_2$ film stoichiometry.

Deposition processes were run with the above two gas mixtures, with acceleration potentials $V_{ACC}$ ranging from 10 to 50 kV. The gas flow rate into the pressure cell chamber was either zero (i.e. off), or set at 20 sccm ("20P"), which translates into a pressure-distance integral of about 0.003 Torr-cm. The GCIB beam current under these conditions ranged from 15 to 49 µA.

Deposited SiO$_2$ films ranged in color from brown to very slightly tinted or colorless, with increasing O$_2$/SiH$_4$ ratio. All films showed evidence of compressive stress in acquired FTIR spectra, which is a common feature of most as-deposited GCIB films. The compressive stress can be reduced or eliminated using a post-deposition anneal process, at a temperature ranging from 600 to 1000 degrees C., and of 15 to 60 min duration, for example. The anneal process also causes the film roughness R$_a$ to decrease from as-deposited values of 6.9 Å to 7.4 Å, which depend weakly on the GCIB process condition, by about 0.3 Å R$_a$. Gap fill experiments were also conducted, in which trenches were successfully filled with SiO$_2$ before trench pinch-off.

Figure 15:
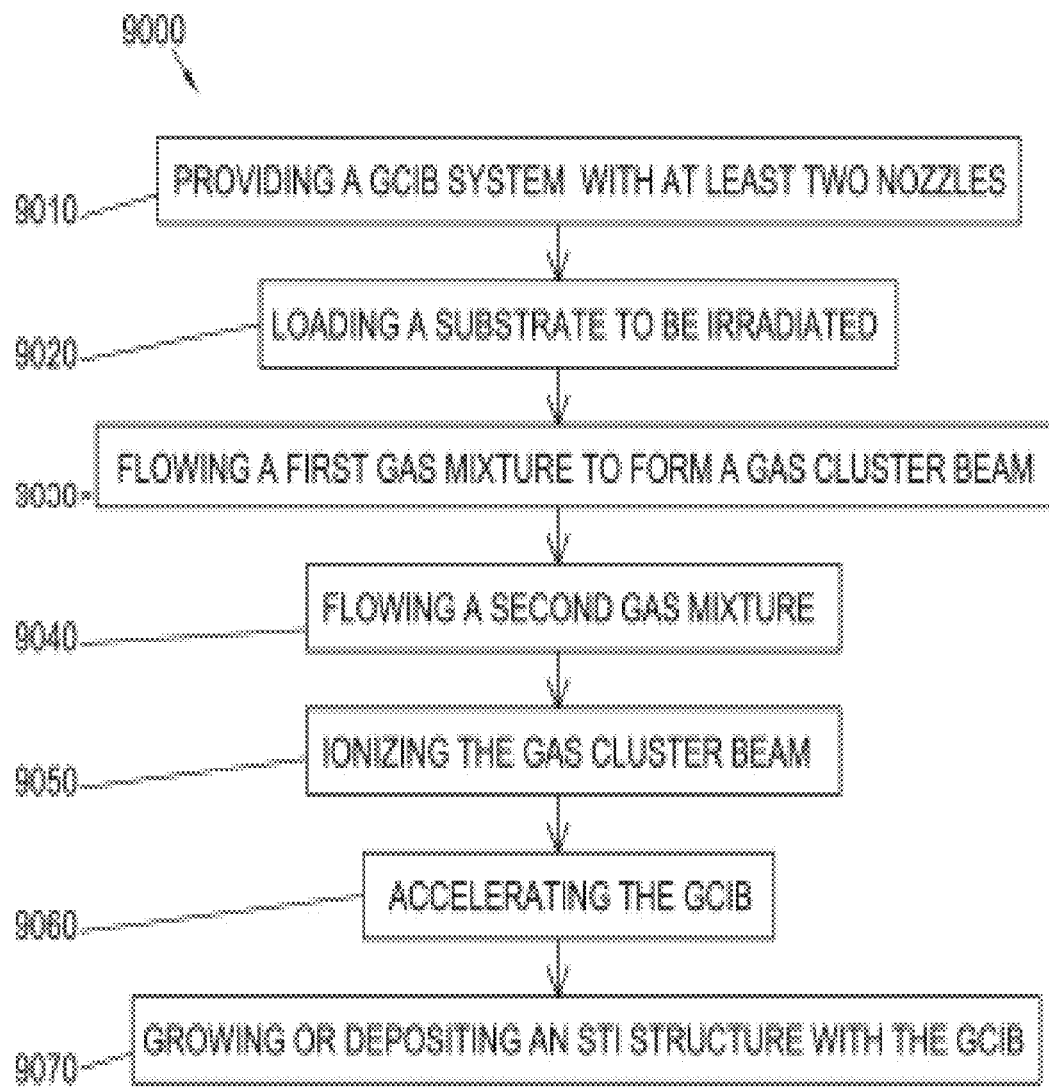
FIG. 15 is a flowchart of an embodiment of a method for formation of a shallow trench isolation (STI) structure using a GCIB system with multiple nozzles.

The flowchart in FIG. 15 shows the steps of a process 9000 of formation of a shallow trench isolation (STI) structure using a GCIB system with multiple nozzle and gas supplies. The process of forming an STI using a conventional single nozzle GCIB processing system is discussed in U.S. Provisional Patent Application No. 61/149,917, entitled "METHOD FOR FORMING TRENCH ISOLATION USING GAS CLUSTER ION BEAM PROCESSING" (Ref. No. EP-169 PROV), the entire content of which is herein incorporated by reference in its entirety.

The method begins with step 9010, with providing a GCIB processing system with a set of at least two nozzles either arranged in mutual close proximity to ensure coalescence of individual gas cluster beams before reaching a single gas skimmer or arranged so as to have intersecting beam axes, a first gas supply configured to supply a subset of the full set of nozzles (e.g. a single nozzle, or multiple nozzles of the subset) with a gas mixture, and a second gas supply to supply the remaining nozzles (i.e. nozzles not supplied by the first gas supply). The GCIB processing system can be any of the GCIB processing systems (100, 100' or 100") described above in FIG. 1, 2 or 3, with any arrangement of nozzles and gas supplies shown in FIGS. 5-13D.

In step 9020, a substrate is loaded into the GCIB processing system. The substrate can include a conductive material, a non-conductive material, or a semi-conductive material, or a combination of two or more materials thereof. Additionally, the substrate may include one or more material structures formed thereon, or the substrate may be a blanket substrate free of material structures. The substrate can be positioned in the GCIB processing system on a substrate holder and may be securely held by the substrate holder. The temperature of the substrate may or may not be controlled. For example, the substrate may be heated or cooled during a film forming process. The environment surrounding the substrate is maintained at a reduced pressure.

In step 9030, a flow of a first gas mixture is started from the first gas supply. The flow of gas through the nozzle or subset of nozzles connected to the first gas supply forms a gas cluster beam which passes through the single gas skimmer into the ionization chamber of the GCIB processing system.

In step 9040, a second gas mixture is introduced from the second gas supply into all or a subset of the remaining nozzles (i.e. nozzles not supplied by the first gas supply) to form a gas cluster beam or beams that coalesces and/or intersects with the beam or beams from the first nozzle or subset of nozzles to form a single gas cluster beam.

a. In step 9050, the single gas cluster beam is ionized in an ionizer, such as, for example, ionizer 300 of FIG. 4, to form a gas cluster ion beam (GCIB). In step 9060, the GCIB is accelerated by applying a beam acceleration potential to the GCIB.

b. In step 9070, the GCIB composed of the first gas mixture and the second gas mixture is used to irradiate the substrate loaded in the GCIB processing system, to form an STI structure on the substrate, or on a layer atop the substrate. The STI structure can be used, for example, in a memory device.

c. To form an SiO2 STI structure, i.e. to fill the STI trench with SiO2, the first gas mixture may comprise a silicon-containing gas. For example, the first gas mixture may comprise SiH4, Si2H6, C4H12Si, C3H10Si, H3C-SiH3, H3C-SiH2-CH3, (CH3)3-SiH, (CH3)4-Si, SiH2Cl2, SiCl3H, SiCl4, SiF4, alkyl silane, an alkane silane, an alkene silane, an alkyne silane, or any combination of two or more thereof. Optionally, the first gas mixture may further comprise an inert dilution gas. The dilution gas may comprise a noble gas, such as for example, He, Ne, Ar, Kr, Xe, or Rn. To form the STI structure, the second gas mixture may comprise an oxygen-containing gas. For example, the second gas mixture may comprise O2, CO, CO2, NO, NO2, N2O, or any combination of two or more thereof. Optionally, the second gas mixture may further comprise an inert dilution gas. The dilution gas may comprise a noble gas, such as for example, He, Ne, Ar, Kr, Xe, or Rn, or any combination of two or more thereof.

d. Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

e. Various operations may have been described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As mentioned above, FIG. 16A, FIG. 16B, FIG. 17, FIG. 18A, FIG. 18B, FIG. 19, FIG. 20, FIG. 21A, FIG. 21B, FIG. 22, FIG. 23, FIG. 24, and FIG. 25 relate to a deflection system comprising a GCIB processing system that can utilize a single or a multiple nozzle GCIB system. The components of the GCIB processing system includes a GCIB system, deflection plates, a substrate, a beam gate, a process chamber, deflection circuit, a substrate scanner, and a power supply. The detail description related to the aforementioned list of figures follow.

Figure 16A:
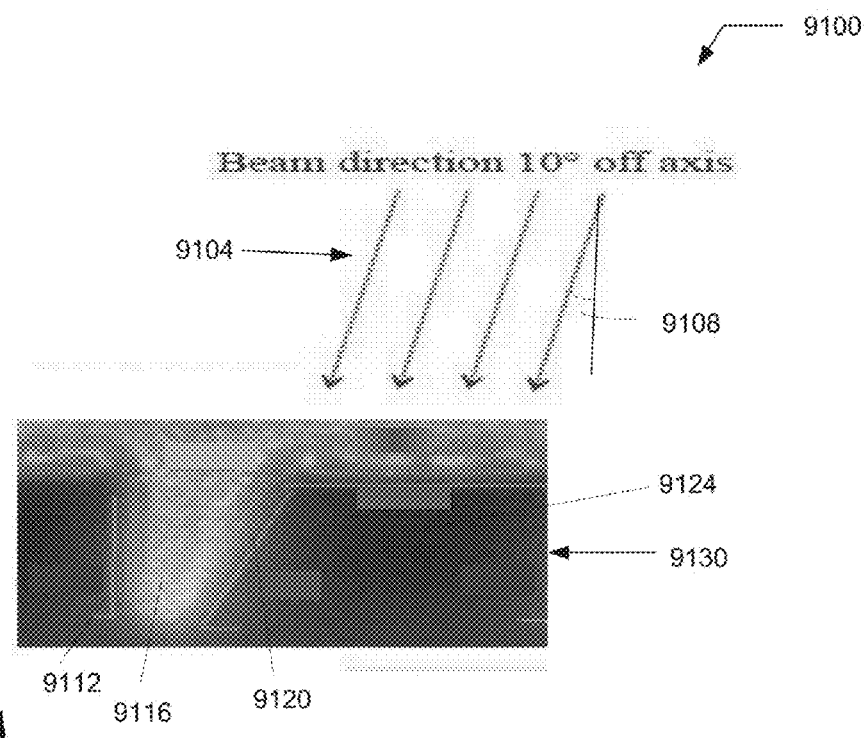

FIG. 16A shows a 10 degree off-axis beam 9108 direction and an exemplary cross sectional image 9100 view of the structures 9124 irradiated with GCIB 9104 in an embodiment of the present invention. The GCIB 9104 is directed to the structure 9124 on a substrate 9130 at a 10 degree off axis angle 9108. Note the slope 9120 of the via 9116 is substantially the same as the off axis angle 9108 of the GCIB rays 9104. The effect of deflection of the GCIB expressed as the off axis angle 9108 is apparent in the shape of the via 9116.

Figure 16B:
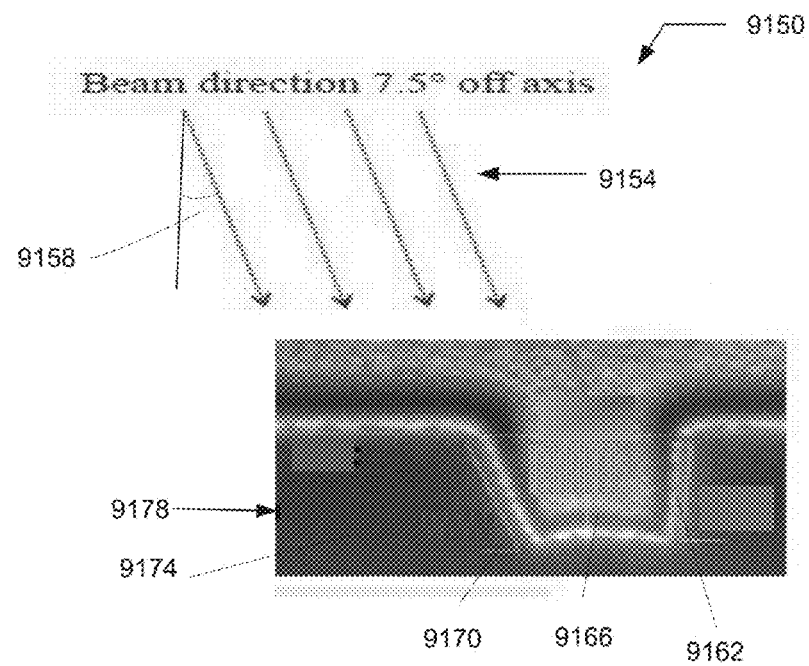
FIG. 16B shows a 7.5 degree off-axis beam direction and an exemplary cross sectional image view of the structures irradiated with GCIB in an embodiment of the present invention.

FIG. 16B shows a 7.5 degree off-axis beam 9158 direction and an exemplary cross sectional image 9150 view of the structures irradiated with GCIB 9154 in an embodiment of the present invention. The GCIB 9154 is directed to the structure 9174 on a substrate 9178 at a 7.5 degree off-axis angle 9158. Note the slope 9170 of the via 9116 is substantially the same as the off axis angle 9158 of the GCIB rays 9154. Similarly, the effect of deflection of the GCIB expressed as the off axis angle 9158 is apparent in the shape of the via 9166.

Figure 17:
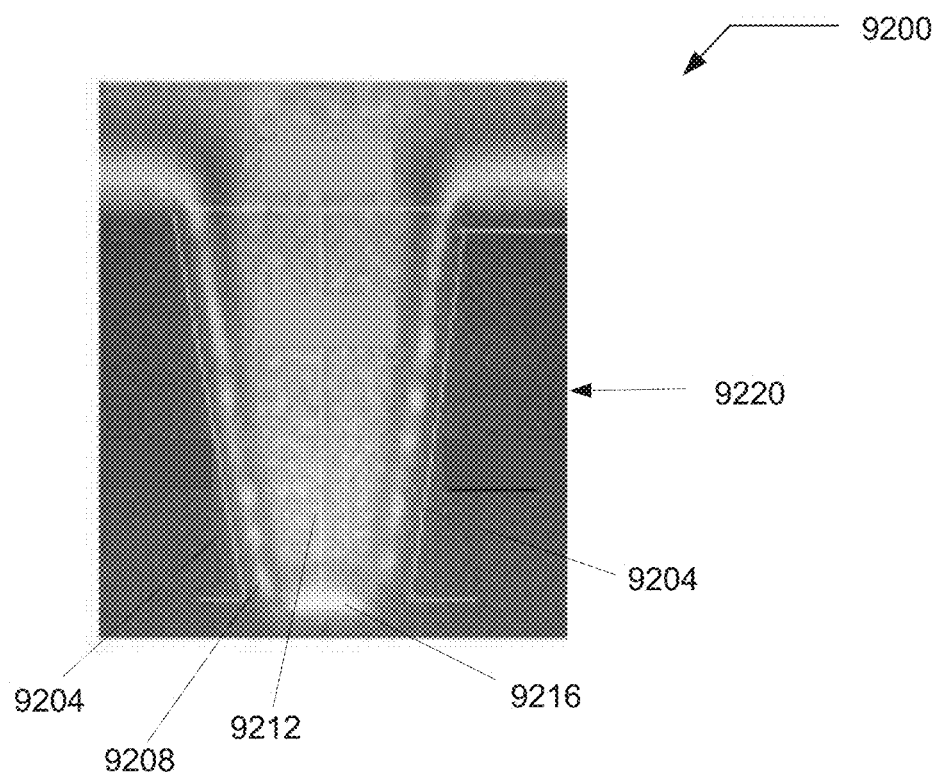
FIG. 17 shows an exemplary cross sectional image view of the structures irradiated with GCIB with zero deflection.

FIG. 17 shows an exemplary cross sectional image 9200 view of the structures irradiated with GCIB with zero deflection, a situation where the deflection angle of the GCIB is zero. Notice that the via 9208 has an inverted trapezoid shape, wider at the top and narrower at the bottom with the sidewall 9204 sloping till the bottom 9216. At the middle of the bottom of the via 9216, the effect of the GCIB is concentrated on the structure 9220, such that if the operation is an etch process, there would be some over etching at the bottom center of the via 9216.

Figure 18A:
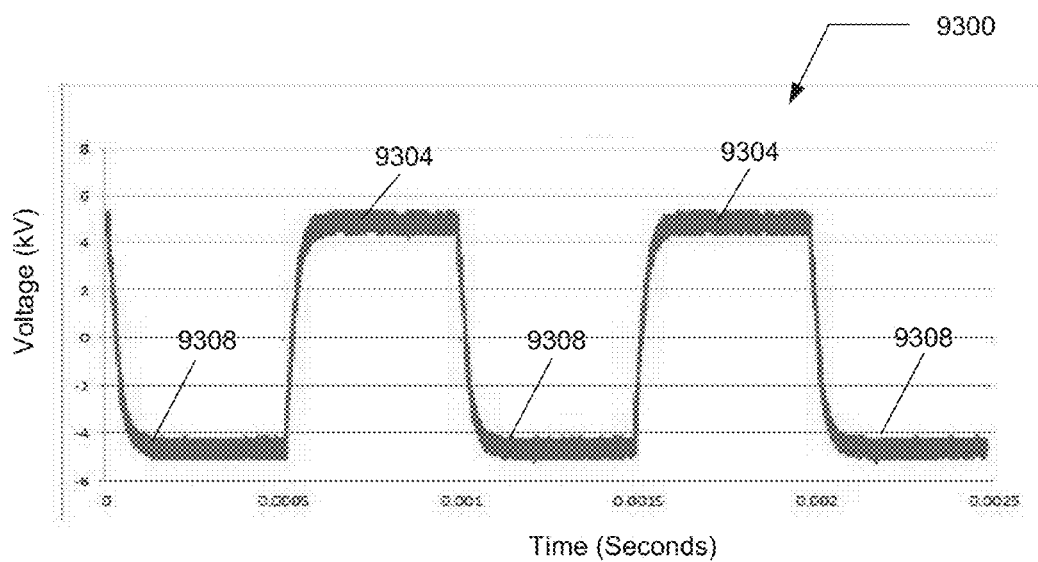
Figure 18B:
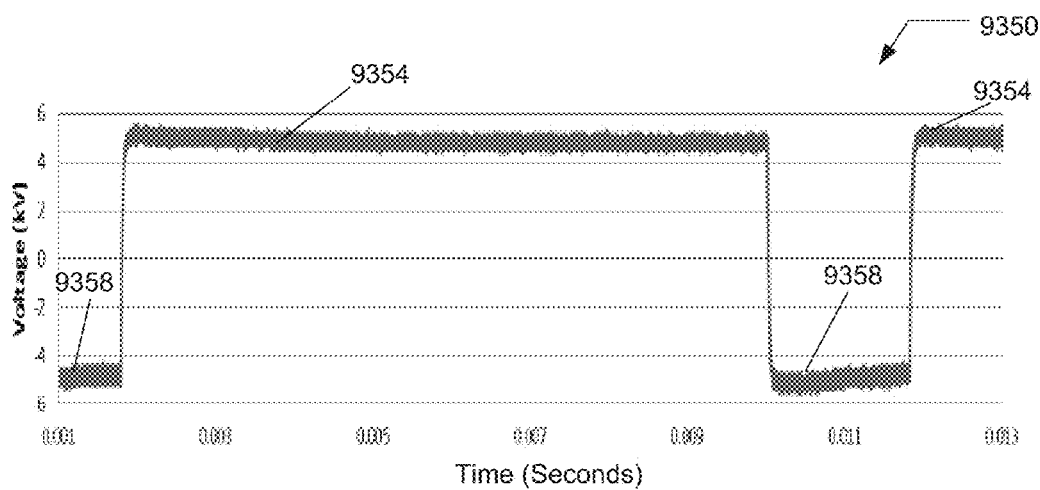
FIG. 18B is another exemplary graph of the differential voltage in the deflection plates as a function of time at 100 Hz in one embodiment of the present invention.

FIG. 18A is an exemplary graph 9300 of the voltage in the deflection plates as a function of time at 1 KHz in one embodiment of the present invention. The voltage 9304 at the top of the wave form and the voltage 9308 at the bottom of the wave form provide a way to control the deflection angle of the GCIB from right side deflection angle, through zero, switching to the left side deflection angle. Operating variables used to control the deflector beam output include the voltage differential between the deflection plates, length of time to switch from maximum positive to maximum negative voltage, differential frequency, and percent split duty cycle. FIG. 18B is another exemplary graph 9350 of the voltage in the deflection plates as a function of time at 100 Hz and 20/80% duty cycle in another embodiment of the present invention. In a similar manner, the voltage 9354 at the top of the wave form and the voltage 9358 at the bottom of the wave form provide a way to control the deflection angle of the GCIB from right side deflection angle, through zero, switching to the left side deflection angle.

Figure 19:
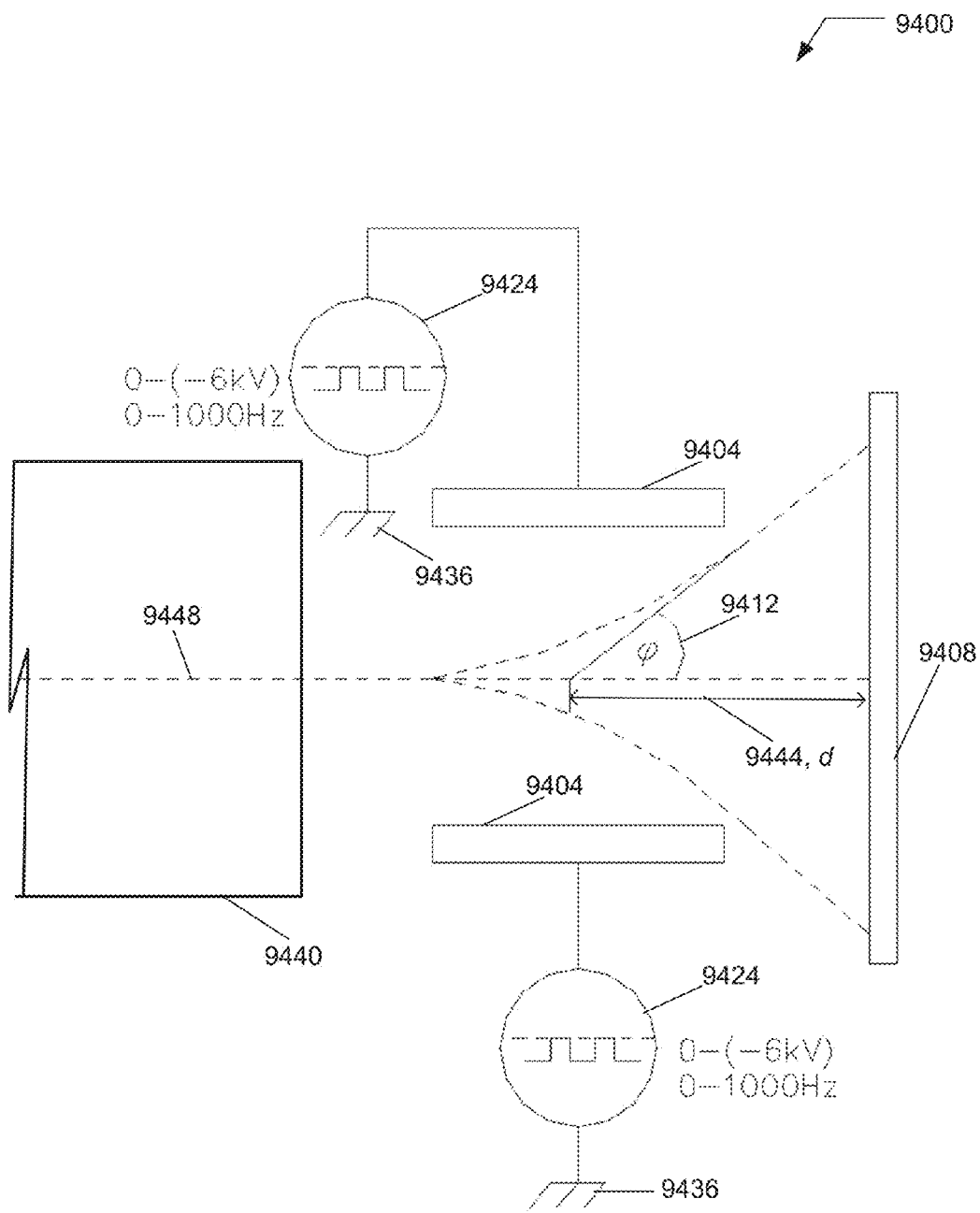
FIG. 19 is a schematic of a GCIB system configured to control the GCIB deflection within a target deflection range of the structure in the substrate in an embodiment of the present invention.

FIG. 19 is a schematic 9400 of a GCIB system 9440 configured to control the GCIB deflection within a target area of structures in the substrate 9408 in an embodiment of the present invention. A GCIB 9448 is generated by the GCIB system 9440 using one or more nozzles (not shown) where the GCIB 9448 passes in between two deflection plates 9404 coupled to a power source 9424 and ground 9436. Power from the power source 9404 is used to deflect the GCIB to a deflection angle 9412 off the axis of the GCIB. The deflection angle 9412 can be in the range 0 to 30 degrees or a range of 0 to 16 degrees. The substrate distance d, 9444, from the middle of the deflection plates to the surface of the substrate is another operating variable that needs to be controlled. The deflection angle $\phi$ is the angle 9412 of the deflected GCIB off the axis of the GCIB.

Figure 20:
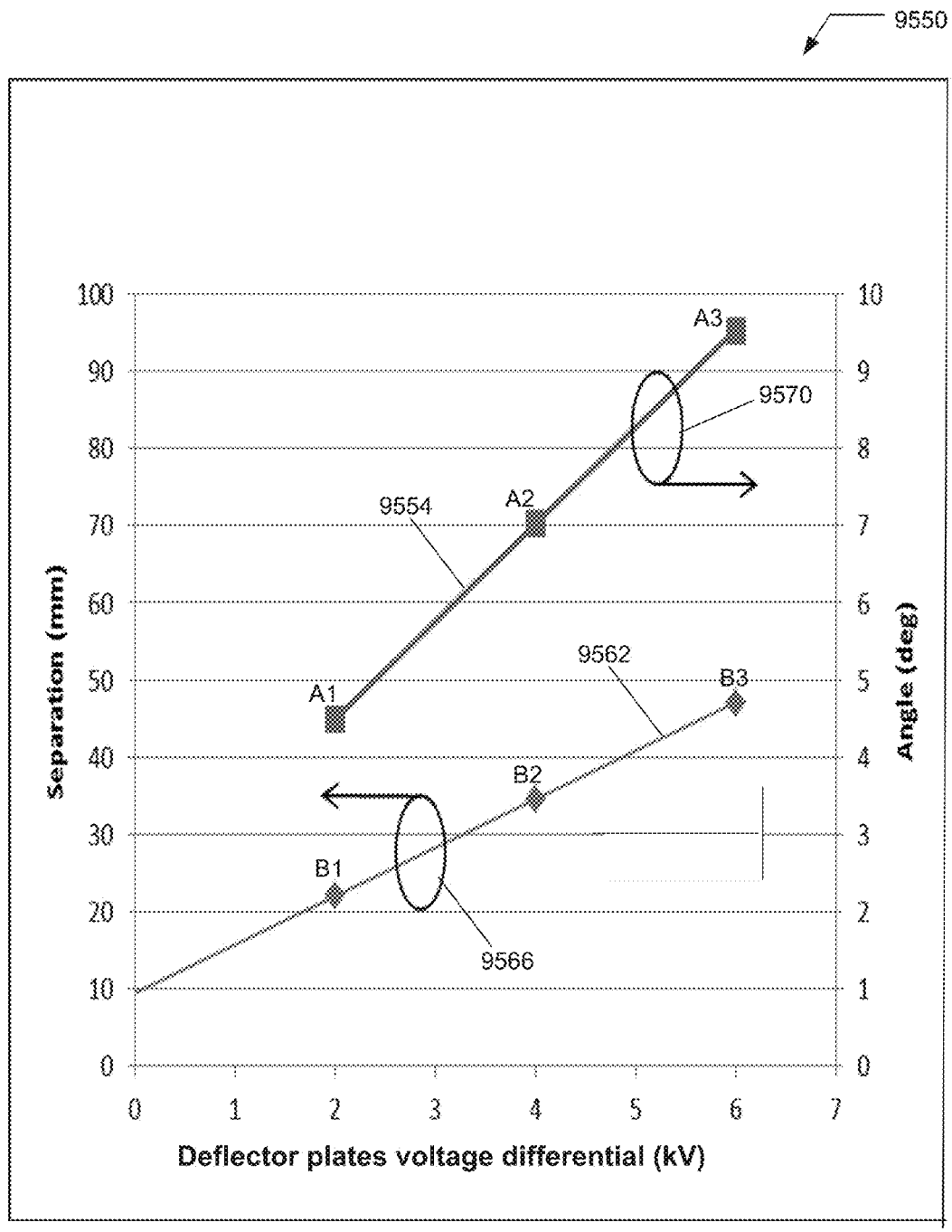
FIG. 20 is an exemplary graph of spot separation versus defection plates voltage differential and an exemplary graph of deflection angle versus defection plates voltage differential in a GCIB implementation of an embodiment of the present invention.

FIG. 20 includes an exemplary graph 9550 of spot separation versus deflection plates voltage differential and an exemplary graph 9554 of deflection angle versus deflection plates voltage differential in a GCIB implementation of an embodiment of the present invention. In curve 9562, at point B1 of 2 kV, the separation is 22 mm, at point B2, the separation is 35 mm, and at point B3, the separation is 47 mm, using the left hand X-axis as indicated by the directional arrow 9566. In curve 9554, at point A1 of 2 kV, the separation is 4.5 degrees, at point B2, the separation is 7.0 degrees, and at point B3, the separation is 9.5 degrees, using the right X-axis as indicated by the directional arrow 9570. The curves show linear correlations between spot separation versus deflection plates voltage differential and deflection angle versus deflection plates voltage differential volts; however, other correlations are possible depending on the semiconductor application.

Figure 21A:
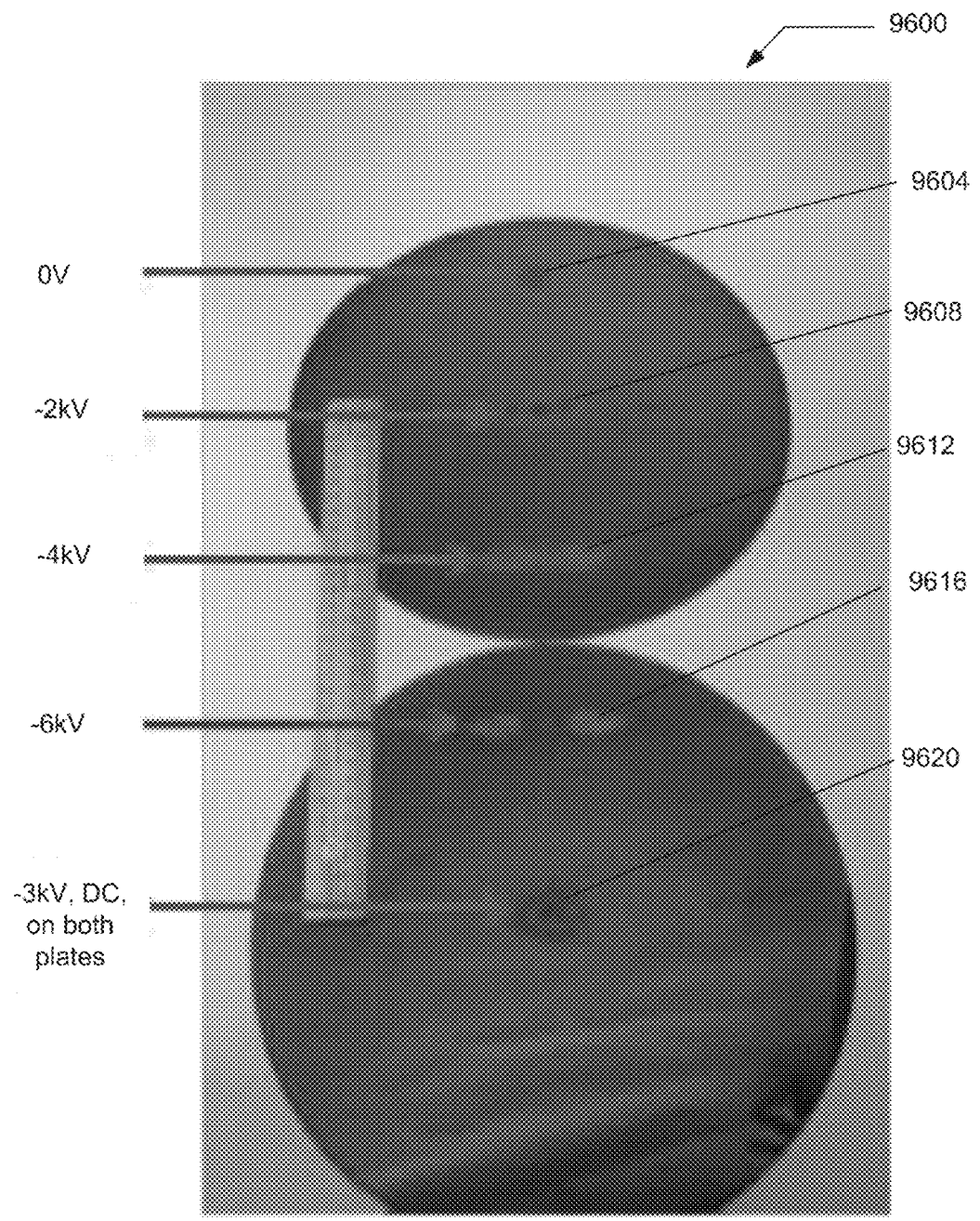
Figure 21B:
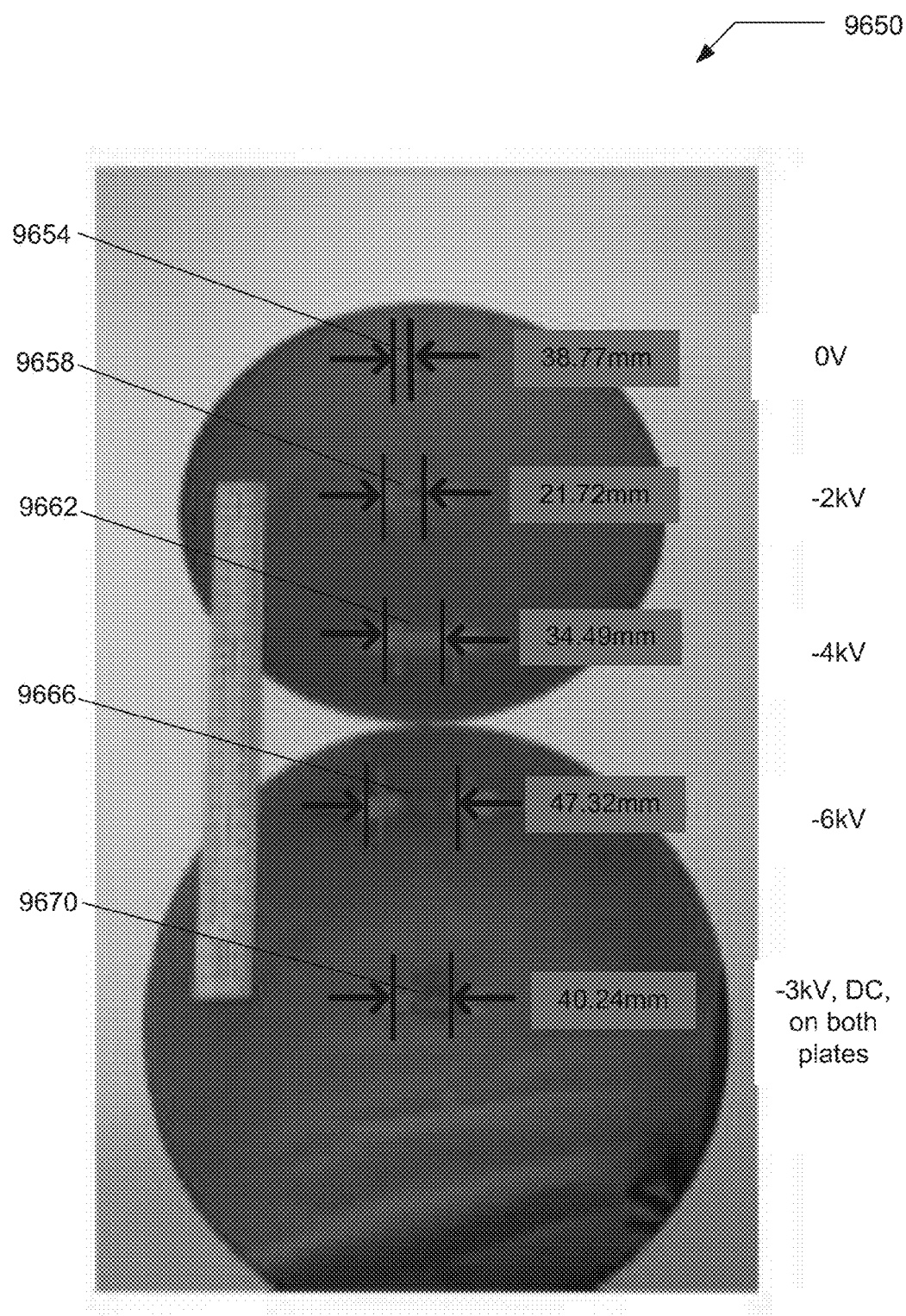
FIG. 21B depicts exemplary images of the separation of the beam burns as a function of deflection plate voltage differential in several embodiments of the present invention.

FIG. 21A shows exemplary beam burns images 9600 as a function of deflection plates voltage differential. The beam burns corresponding to 0 kV, −2 kV, −4 kV, −6 kV show progressively longer burns further apart as indicated by points 9604, 9608, 9612, and 9616. The exemplary beam burn images show a linear correlation to the deflection plates voltage differential. The beam burns for −3 kV DC on both plates, point 9620, produced a different shape of the beam burns. The correlation is different if DC power is used on both deflection plates, as indicated by the shape and distance of the beam burns in point 9620. FIG. 21B shows exemplary images 9650 of the separation of the beam burns as a function of deflection plates voltage differential in several embodiments of the present invention. The separation of the beam burns is 38.77 mm, 21.72 mm, 34.49 mm, 47.32 mm, and 40.24 corresponding to plate voltage of 0 kV, −2 kV, −4 kV, −6 kV as indicated by 9504, 9058, 9062, and 9666. As mentioned above, data on the separation of the beam burns when DC is used on both deflection plates as indicated by point 9670 is different from the linear correlation when AC or a combination of AC and DC power is used. These data and correlations of variables are input into the controller to be discussed below in relation to FIG. 22.

Figure 22:
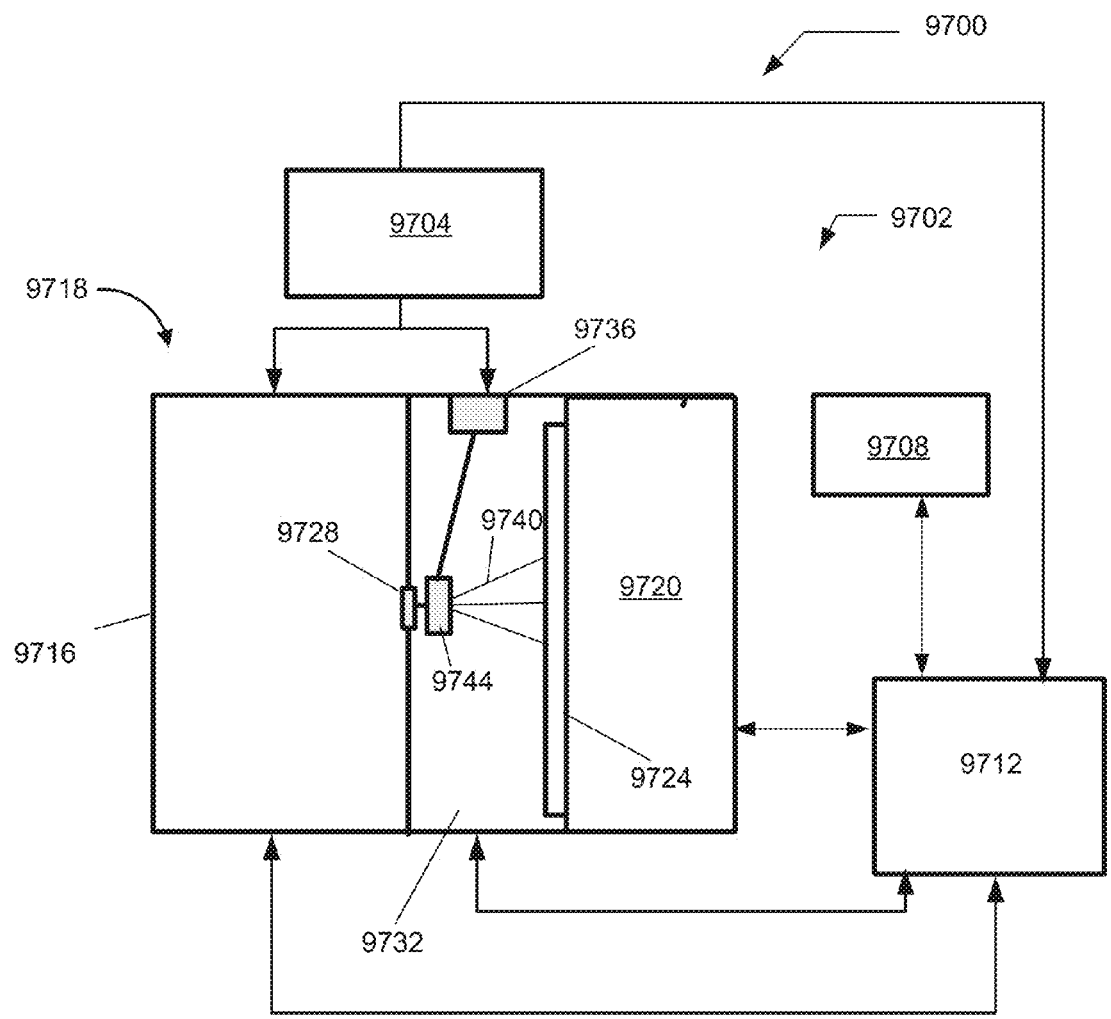
FIG. 22 is an exemplary schematic for a control system configured to control deflection operating variables of a GCIB system to achieve beam deflection objectives.

FIG. 22 is an exemplary schematic 9700 for a deflection control system 9702 configured to control deflection operating variables of a GCIB system 9716 to achieve beam deflection objectives. The deflection control system 9702 comprises a controller 9712, an input and output device 9708, a GCIB processing system 9718 comprising a GCIB system 9716, deflection plates 9744, a substrate 9724, a beam gate 9728, a process chamber 9732, deflection circuit 9736, a substrate scanner 9720, and a power supply 9704. The deflection controller 9712 can be a processor such as a notebook, laptop, or desk computer or a remote computer connection. The power supply 9704 can be an AC, DC or both able to supply the deflector voltage differential required as specified and discussed below in relation to FIG. 23. Empirical or historical data is entered using the input/output device 9708. Empirical or historical data includes ranges of the deflection operating parameters, correlations of the deflection operating parameters to each other and to the objectives established for the deflection application. The data can include recipes, machine instruction, logic circuitry or computer code that can be stored in controller 9712 in order to optimize the deflection operating parameters and achieve the deflection objectives of the semiconductor deflector application. The controller 9712 can utilize any processors or computing resources available including those control systems described in relation to the multiple nozzle GCIB system described above.

Figure 23:
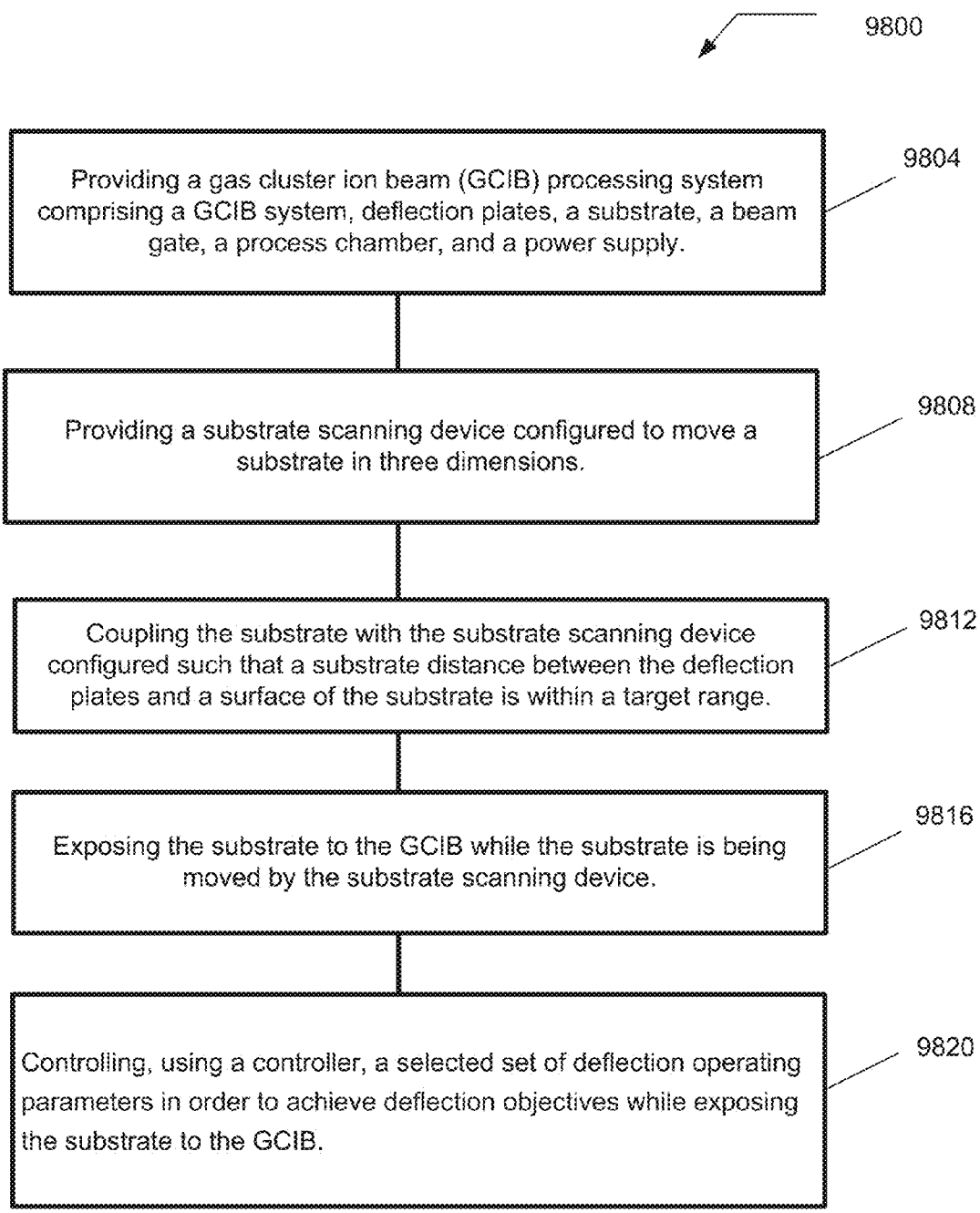
FIG. 23 is a flowchart of an embodiment of a method for controlling the GCIB processing in a target area of a structure on a substrate in an embodiment of the present invention.

FIG. 23 is a flowchart 9800 of an embodiment of a method for controlling the GCIB deflection processing in a target area of a structure on a substrate in an embodiment of the present invention. In operation 9804, a GCIB processing system comprising a GCIB system, deflection plates, a substrate, a beam gate, a process chamber, and a power supply is provided.

In operation 9808, a substrate scanning device configured to move the substrate in three dimensions is provided in the process chamber. In operation 9812, the substrate is coupled with the substrate scanning device, the substrate scanning device disposed in the process chamber such that a substrate distance between the deflection plates and a surface of the substrate is within a target substrate distance range. In operation 9816, the substrate is exposed to the GCIB while the substrate is being moved by the substrate scanning device in one or more dimensions.

In operation 9820, using a deflection controller, a set of deflection operating parameters are controlled in order to achieve selected deflection objectives. The deflection objectives can include target ranges of the critical dimensions of the structure on the substrate, for example, width, height, and sidewall angle of a via in an etch process, a depth of doping in the structures in a doping process, percentage of removal of material or layer on the substrate, or percentage completion of a process operation and the like. Deflection operating parameters can include the deflection angle φ, voltage differential of the deflection plates, frequency of the deflection plate power, beam current, substrate distance d, pressure in the nozzle, gas flow rate in the process chamber, separation of beam burn, duration of the bean burn, duty cycle of the beam deflector output, and the like. The deflection angle φ can be in the range of 0 to 16 degrees or 0 to 30 degrees, deflection plates voltage differential can be in the range from 0 to 30 kV, 0 to −30 kV, or 30 to 60 kV, frequency of the deflection plate power can be in a range from 0 to 1,000 Hz, the beam current can be in a range from 50 to 250 μA, substrate distance d can be in a range from 4 to 8 cm, pressure in the nozzle can be in a range from 200 to 300 psi, gas flow rate in the process chamber can be in a range from 400 to 900 sccm, separation of beam burn can be in a range from 0 to 100 mm, duration of the bean burn can be in a range from 5 to 20 seconds, and the duty cycle of the beam deflector output can be in a range from 20/80% to 50/50%. The gas in the gas flow can include one or more of nitrogen ($N_2$), argon (Ar), 6% chlorine/nitrogen ($Cl_2/N_2$), 20% triflouromethane ($CHF_3$), helium (He2), nitrogen triflouride ($NF_3$), silicon tetraflouride ($SiF_4$), and the like.

Figure 24:
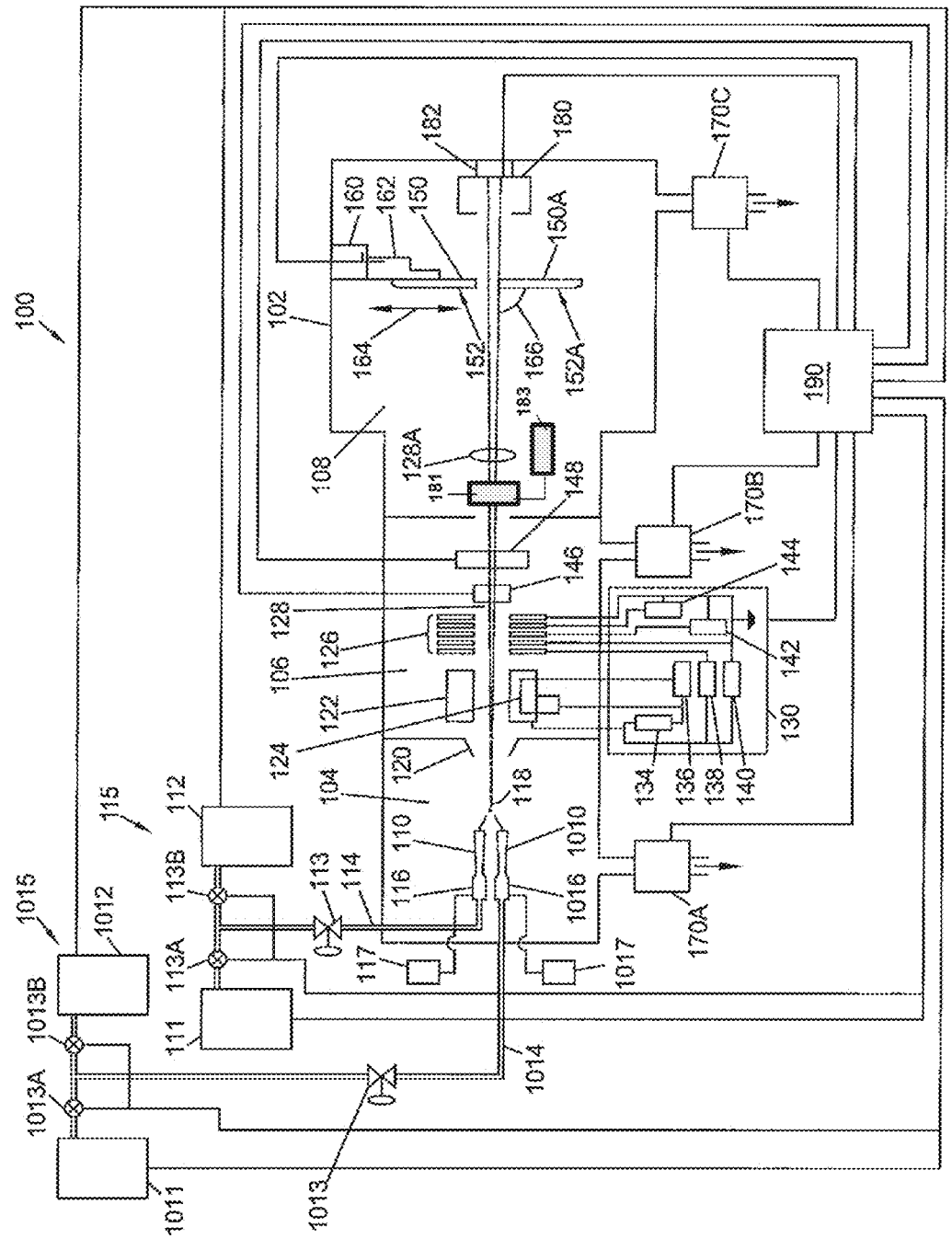
FIG. 24 is an exemplary schematic of a multiple nozzle GCIB system showing deflector plates and associated circuitry and a deflector power supply in an embodiment of the present invention.

FIG. 24 is a schematic 100''' of a multiple nozzle GCIB system showing deflector plates and associated circuitry and a deflector power supply in an embodiment of the present invention. The description of the GCIB system is similar to the description used in FIG. 1 and will not be repeated here. The deflector plates and associated circuitry 181 coupled to the deflector power supply 183 are situated in the processing chamber 108 past the beam gate 148 and before designator 152 and 152A disposed on the path of the process GCIB 128A. The deflector plates 181 are disposed parallel to the beam 118. The power supply 183 may include alternating current (AC), direct current DC, or a combination of both.

Figure 25:
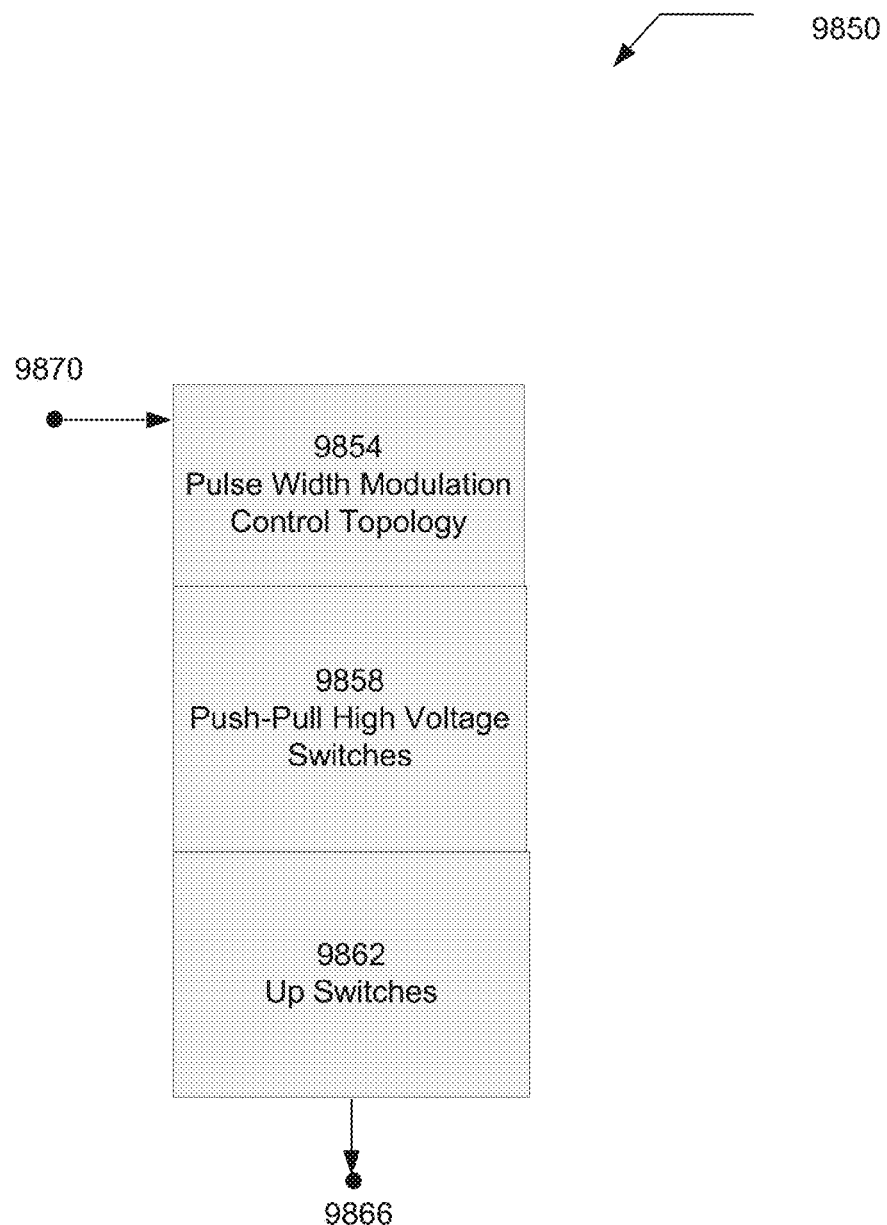
FIG. 25 is an exemplary schematic of the circuitry required for achieving the design requirements of the deflector plate functionality in an embodiment of the present invention.

FIG. 25 is a schematic 9850 of the circuitry required for achieving the design requirements of the deflector plate functionality for deflection processing in an embodiment of the present invention. The pulse width modulation (PWM) control topology 9854 provides a capability to make a bipolar high voltage power supply that can produce rapidly switching outputs that could be modulated slowly and may have an arbitrary or adjustable midpoint reference. A PWM-based control topology allows for infinitely variable on-off times. Utilizing insulated gate bipolar transistors (IGBT) that are simultaneously switched and discreet high voltage transistors in conjunction with adjustable, fast recovery high voltage power supplies can be used to build inexpensive, isolated high voltage fields that are fully adjustable. These can be used in an AC, DC or a combination of the two modes. The design takes advantage of the parasitic capacitance of the gate of the IGBT to allow for very long on-times. Further, the design uses high voltage transformer isolation techniques to rapidly discharge the gates for shorter on-times. Two power supplies are designed into the deflection plates so as to provide fast recovery and built-in fully adjustable outputs.

Utilizing isolated PWM drive techniques allows for floating, uncommitted high voltage references and power source used in deriving the high voltage output waveforms as previously described in relation to FIG. 18A and FIG. 18B. Driving the deflection plates at a high frequency allows for a one-turn primary to drive the gate transformers which facilitates a simple isolation scheme taking advantage of the wire insulation. The design also takes advantage of the parasitic capacitance in the gate of the IGBT to allow for very long on-times and uses the transformer isolation technique to rapidly discharge the gates for shorter on-times. As mentioned above, two power supplies are designed to fit into the unit to provide the +/− high voltage references. These power supplies are designed to have fast recovery and fully adjustable outputs. Moreover, the signal for turning the up-switches and turning the down-switches after a brief delay is sent to ensure zero cross-conduction.

Turning transistors on and off with a controlled duty-cycle is a new feature of the circuitry 9850 that includes the PWM control topology 9854, the push-pull high voltage switches 9858, and the up/down switches 9862, starting with the + or −6 kV supply 9870 and ending up with + or −6 kV output 9866. The isolation techniques use a high voltage insulated wire for a single-turn primary that passes through all of the drive transformers. Other components include the ground referenced controller (not shown) in the PWM control topology 9854 and steering logic (not shown) for the up/down signals in the up/down switches 9862. The up pulses turn on one bank of transistors with a small delay, and at the same time turning off the opposite bank. The down pulse then does the opposite. This back and forth switching allows for twice the voltage swing of a single-ended set of switches. The high voltage busses can also be modulated using very fast recovery high voltage power supplies. This allows an infinite range from zero bus voltage of the deflection fields. This capability facilitate superimposed signals such as those shown with FIG. 18A and FIG. 18B.

Although the detail examples included a via deflection processing using a GCIB, other applications for the deflection processing include modifying, depositing, growing, or doping of a layer in the substrate. Cleaning, etching, and doping processes on line-and-space or 3-dimensional applications can utilize the methods and techniques described above.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. A method of controlling a gas cluster ion beam (GCIB) system for processing a structure on a substrate, the method comprising:
   providing a GCIB system comprising deflection plates that direct a GCIB towards a substrate and a deflection circuit;
   providing a substrate scanning device configured to move the substrate in three dimensions;

coupling the substrate with the substrate scanning device configured such that a substrate distance between the deflection plates and a surface of the substrate stay within a target range;

exposing the substrate to the GCIB while the substrate is being moved by the substrate scanning device in one or more dimensions;

controlling, using a controller, a deflection angle φ of the GCIB incident upon the substrate by controlling a set of deflection operating parameters while the substrate is being exposed to the GCIB in order to achieve one or more deflection objectives.

2. The method of claim 1 wherein the one or more deflection objectives include one or more of a target width, a height, a sidewall angle of the structure on the substrate, a percentage of removal of material or layer on the substrate, or a percentage completion of a process operation.

3. The method of claim 2 wherein the set of deflection operating parameters comprises one or more of a voltage differential of the deflection plates, a frequency of a deflection plate power, a beam current, a substrate distance d, a pressure in a nozzle, a gas flow rate in a process chamber, a separation of beam burns, a duration of a beam burn, and/or a duty cycle of a beam deflector output.

4. The method of claim 1 wherein the deflection angle φ of the GCIB is controlled in a range from 0 to 30 degrees.

5. The method of claim 3, wherein controlling the set of deflection operating parameters comprises controlling the voltage differential of the deflection plates to within a range from −10 kV to 10 kV.

6. The method of claim 3, wherein controlling the set of deflection operating parameters comprises controlling the frequency of the deflection plate power to within a range from 0 to 1,000 Hz.

7. The method of claim 3, wherein controlling the set of deflection operating parameters comprises controlling the separation of beam burns to within a range from 0 to 100 mm.

8. The method of claim 3, wherein controlling the set of deflection operating parameters comprises controlling the substrate distance d, from the deflection plates to within a range from 4 to 8 cm.

9. The method of claim 3, wherein controlling the set of deflection operating parameters comprises controlling the voltage differential of the deflection plates to within a range from −10 kV to 10 kV, or from 30 to 60 kV, the separation of beam burns to within a range from 0 to 100 mm, and/or the substrate distance d to within a range from 4 to 8 cm to control the deflection angle φ to a range from 0 to 30 degrees.

10. The method of claim 9, wherein controlling the set of deflection operating parameters comprises controlling the nozzle pressure to within a range from 100 to 300 psi, the gas flow rate to within a range from 400 to 900 sccm, the beam current to within a range from 50 to 250 µA and/or the gas flow rate of one or more of nitrogen ($N_2$), argon (Ar), 6% chlorine/nitrogen ($Cl_2/N_2$), 20% triflouromethane ($CHF_3$), helium ($He_2$), nitrogen triflouride ($NF_3$), and/or silicon tetraflouride ($SiF_4$).

11. The method of claim 10, wherein controlling the set of deflection operating parameters comprises controlling the duration of the beam burn of the GCIB to within a range from 2 to 20 seconds and the duty cycle of the beam deflector output to within a range from 10/80% to 50/50%.

12. The method of claim 3 wherein the GCIB system is configured to modify or grow or dope a layer on the substrate.

13. The method of claim 3 wherein the GCIB system is configured to deposit a layer on the substrate.

14. The method of claim 3 wherein the GCIB system is configured to etch or clean a layer on the substrate.

15. The method of claim 3 wherein the GCIB system is configured to perform modifying, depositing, growing, or doping of a layer in the substrate wherein the substrate is a wafer, a flat panel display (FPD), or a liquid crystal display (LCD).

16. The method of claim 3 wherein the GCIB system comprises a first chamber wherein a gas cluster beam can be formed, a second chamber wherein the gas cluster beam is ionized and accelerated, and a third chamber wherein an accelerated GCIB is utilized to treat the substrate, and/or
wherein one or more individual cluster beams injected by nozzles are used to generate a single gas cluster beam.

17. The method of claim 14 wherein constituent gas clusters in gas cluster beams are ionized by one or more ionizers, the ionizer comprising an electron impact ionizer that produces electrons from one or more filaments.

18. The method of claim 15, wherein the GCIB has a GCIB intensity, and:
wherein the GCIB intensity is modulated by varying a lens focus by changing a first and/or a second lens voltage or mechanically blocking a portion of the GCIB with a variable beam block, adjustable shutter, or variable aperture,
wherein the GCIB intensity is modulated by varying the gas flow from a GCIB source supply, and/or
wherein the GCIB intensity is modulated by either varying a filament voltage or varying an anode voltage.

19. The method of claim 15 wherein a GCIB dose received for a given area of the substrate is changed by adjusting a scan velocity in order to achieve a beam dwell time to treat different regions of the substrate.

20. The method of claim 7, wherein controlling the set of deflection operating parameters further comprises:
controlling a high voltage bipolar power supply configured to rapidly switch outputs that could be modulated slowly with an arbitrary or adjustable midpoint reference and can use alternating current, direct current or a combination of alternating current and direct current.

* * * * *